US012813145B2

(12) United States Patent
Mok et al.

(10) Patent No.: US 12,813,145 B2
(45) Date of Patent: Nov. 24, 2026

(54) DISPLAY DEVICE INCLUDING AN OPTICAL LAYER

(71) Applicant: SAMSUNG DISPLAY CO., LTD., Yongin-si (KR)

(72) Inventors: Rang Kyun Mok, Yongin-si (KR); Tae Ho Lee, Yongin-si (KR); Young Sang Ha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 116 days.

(21) Appl. No.: 18/903,108

(22) Filed: Oct. 1, 2024

(65) Prior Publication Data

US 2025/0295014 A1 Sep. 18, 2025

(30) Foreign Application Priority Data

Mar. 13, 2024 (KR) ........................ 10-2024-0035130

(51) Int. Cl.
*H10K 59/80* (2023.01)
*H10K 59/126* (2023.01)
*H10K 59/38* (2023.01)

(52) U.S. Cl.
CPC ......... *H10K 59/879* (2023.02); *H10K 59/126* (2023.02); *H10K 59/38* (2023.02)

(58) Field of Classification Search
CPC ..... H10K 59/879; H10K 59/38; H10K 59/126
See application file for complete search history.

(56) References Cited

U.S. PATENT DOCUMENTS 8,885,018 B2 * 11/2014 Smith .................. H04N 13/359 348/42
10,933,746 B2 3/2021 Lee
11,860,459 B2 1/2024 Kim et al.
12,418,002 B2 * 9/2025 Seo ........................ H10W 90/00
2004/0150329 A1 * 8/2004 Asai ...................... H10K 59/879 313/506
2019/0371866 A1 * 12/2019 Kim ........................ H10K 59/38
2020/0144333 A1 * 5/2020 Kim ........................ H10K 59/38
2022/0352268 A1 * 11/2022 Seo ........................ H10W 90/00
(Continued)

FOREIGN PATENT DOCUMENTS

CN 101630067 * 1/2010
KR 10-2143372 B1 8/2020
KR 10-2022-0058946 A 5/2022
(Continued)

*Primary Examiner* — Mary Ellen Bowman
(74) *Attorney, Agent, or Firm* — F. CHAU & ASSOCIATES, LLC

(57) ABSTRACT

A display device includes: a substrate; a light emitting element layer disposed on the substrate and including first to fourth light emitting elements; a color filter layer disposed on the light emitting element layer and including a first color filter overlapping the first and second light emitting elements and a second color filter overlapping the third and fourth light emitting elements; and an optical layer disposed on the light emitting element layer and including a first prism pattern, which overlaps the first and second light emitting elements, and a second prism pattern, which overlaps the third and fourth light emitting elements, wherein each of the first and second prism patterns has lower surfaces that extend in a diagonal direction and that are adjacent to the light emitting element layer.

20 Claims, 11 Drawing Sheets

(56) References Cited

U.S. PATENT DOCUMENTS

| | | | | |
|---|---|---|---|---|
| 2023/0217794 | A1 | 7/2023 | Kim et al. | |
| 2024/0276848 | A1* | 8/2024 | Hao | H10K 59/879 |

FOREIGN PATENT DOCUMENTS

| | | | |
|---|---|---|---|
| KR | 10-2023-0104506 | A | 7/2023 |
| KR | 10-2552508 | B1 | 7/2023 |
| KR | 10-2023-0126296 | A | 8/2023 |
| WO | 2021178397 | A1 | 9/2021 |

* cited by examiner

DISPLAY DEVICE INCLUDING AN OPTICAL LAYER

CROSS-REFERENCE TO RELATED APPLICATION

The present application claims priority under 35 U.S.C. § 119(a) to Korean Patent Application No. 10-2024-0035130, filed on Mar. 13, 2024 in the Korean Intellectual Property Office, the disclosure of which is incorporated by reference herein in its entirety.

TECHNICAL FIELD

Aspects of embodiments of the present invention relate to a display device, and more particularly, to a display device including an optical layer.

DISCUSSION OF THE RELATED ART

The usefulness of display devices is increasing with the continuous development of multimedia. In response to this, various types of display devices such as an organic light emitting display (OLED) device and a liquid crystal display (LCD) device are currently under development.

As display devices are used in a variety of applications and devices, such as automotive, medical, and apparel, the desire for display devices that provide high-quality images is increasing. In recent years, display devices have been placed inside a vehicle to provide images to users who are sitting in the driver's seat or the passenger seat. For example, when a display device is placed between the driver's seat and the passenger seat, it is desirable to provide different images to the driver's seat and the passenger seat. For example, it is desirable for the display device to provide navigation images to the driver's seat and entertainment images to the passenger seat at the same time.

SUMMARY

According to embodiments of the present invention, a display device includes: a substrate; a light emitting element layer disposed on the substrate and including a first light emitting element, a second light emitting element, a third light emitting element, and a fourth light emitting element, wherein the first light emitting element and the second light emitting element emit light of a first color, wherein the third light emitting element and the fourth light emitting element emit light of a second color; a color filter layer disposed on the light emitting element layer and including a first color filter overlapping the first and second light emitting elements, a second color filter overlapping the third and fourth light emitting elements, and a light blocking pattern disposed between the first and second color filters; and an optical layer disposed between the light emitting element layer and the color filter layer and including a first prism pattern and a second prism pattern, wherein the first prism pattern overlaps the first and second light emitting elements, and the second prism pattern overlaps the third and fourth light emitting elements, wherein each of the first and second prism patterns has an upper surface and lower surfaces that extend in a diagonal direction with respect to the upper surface and that are adjacent to the light emitting element layer.

In embodiments of the present invention, the first prism pattern includes: a first surface adjacent to the color filter layer and overlapping the first and second light emitting elements; a second surface adjacent to the light emitting element layer and extending from a first side of the first surface and overlapping the first light emitting element; and a third surface adjacent to the light emitting element layer and extending from a second side of the first surface and overlapping the second light emitting element, wherein the first surface is the upper surface of the first prism pattern, and the second and third surfaces are the lower surfaces of the first prism pattern, and wherein the second prism pattern includes: a fourth surface adjacent to the color filter layer and overlapping the third and fourth light emitting elements; a fifth surface adjacent to the light emitting element layer and extending from a first side of the fourth surface and overlapping the third light emitting element; and a sixth surface adjacent to the light emitting element layer and extending from a second side of the fourth surface and overlapping the fourth light emitting element, wherein the fourth surface is the upper surface of the second prism pattern, and the fifth and sixth surfaces are the lower surfaces of the second prism pattern.

In embodiments of the present invention, the second surface and the third surface are symmetrical to each other, and wherein the fifth surface and the sixth surface are symmetrical to each other.

In embodiments of the present invention, light emitted from the first light emitting element is refracted on the second surface and proceeds along a path having a first emission angle, and wherein light emitted from the second light emitting element is refracted on the third surface and proceeds along a path having a second emission angle that is different from the first emission angle.

In embodiments of the present invention, the lower surfaces of the first and second prisms have a slope in a range of about 30 degrees to about 50 degrees.

In embodiments of the present invention, the first prism pattern overlaps the first color filter, and wherein the second prism pattern overlaps the second color filter.

In embodiments of the present invention, a cross-sectional area of the first color filter is smaller than or equal to a cross-sectional area of the first prism pattern, and wherein a cross-sectional area of the second color filter is smaller than or equal to a cross-sectional area of the second prism pattern.

In embodiments of the present invention, the optical layer further includes a partition wall disposed in a non-emission area that is between the second light emitting element and the third light emitting element.

In embodiments of the present invention, the optical layer further includes a refractive layer disposed between the first and second prism patterns and the light emitting element layer, wherein the refractive layer has a first refractive index, and wherein each of the first and second prism patterns has a second refractive index that is higher than the first refractive index.

In embodiments of the present invention, a difference between the first and second refractive indices increases as the first and second prism patterns decrease in thickness.

In embodiments of the present invention, the refractive layer includes: a first surface adjacent to the light emitting element layer; and a second surface opposite the first surface, wherein the second surface of the refractive layer has a shape complementary to the lower surfaces of the first prism pattern and the lower surfaces of the second prism pattern, and wherein the optical layer further includes an auxiliary light blocking pattern disposed in a non-emission area that is between the second light emitting element and the third light emitting element within the refractive layer.

In embodiments of the present invention, the optical layer further includes an auxiliary light blocking pattern disposed between the first and second prism patterns, and wherein the auxiliary light blocking pattern overlaps the light blocking pattern.

In embodiments of the present invention, the display device further includes: a planarization layer disposed between the optical layer and the color filter layer, wherein the first prism pattern, the second prism pattern, and the auxiliary light blocking pattern are in contact with the planarization layer.

In embodiments of the present invention, each of the first and second prism patterns has a cross-sectional shape of at least one of an inverted triangle, an inverted trapezoid, or an inverted pentagon.

In embodiments of the present invention, at least one of the first light emitting element or the second light emitting element is selectively driven, and wherein at least one of the third light emitting element or the fourth light emitting element is selectively driven.

In embodiments of the present invention, the third light emitting element is driven together with the first light emitting element, and wherein the fourth light emitting element is driven together with the second light emitting element.

In embodiments of the present invention, the optical layer includes resin.

According to embodiments of the present invention, a display device includes: a substrate; a light emitting element layer disposed on the substrate and including a first light emitting element, a second light emitting element, a third light emitting element, a fourth light emitting element, wherein the first light emitting element and the second light emitting element emit light of a first color, wherein the third light emitting element and the fourth light emitting element emit light of a second color; a color filter layer disposed on the light emitting element layer and including a first color filter overlapping the first and second light emitting elements and a second color filter overlapping the third and fourth light emitting elements; and an optical layer disposed on the light emitting element layer and including a first prism pattern and a second prism pattern, wherein the first prism pattern overlaps the first and second light emitting elements, and the second prism pattern overlaps the third and fourth light emitting elements, wherein each of the first and second prism patterns has an upper surface and lower surfaces that extend in a diagonal direction with respect to the upper surface, wherein a first lower surface of the lower surfaces of the first prism pattern overlaps the first light emitting element and not the second light emitting element, and a second lower surface of the lower surfaces of the first prism pattern overlaps the second light emitting element and not the first light emitting element, and wherein a third lower surface of the lower surfaces of the second prism pattern overlaps the third light emitting element and not the fourth light emitting element, and a fourth lower surface of the lower surfaces of the second prism pattern overlaps the fourth light emitting element and not the third light emitting element.

In embodiments of the present invention, the first prism pattern overlaps the first color filter, and wherein the second prism pattern overlaps the second color filter.

In embodiments of the present invention, the first prism pattern is spaced apart from the second prism pattern.

BRIEF DESCRIPTION OF THE DRAWINGS

The above and other features of the present invention will become more apparent by describing in further detail exemplary embodiments thereof with reference to the accompanying drawings, in which.

DETAILED DESCRIPTION OF THE EMBODIMENTS

Figure 1:
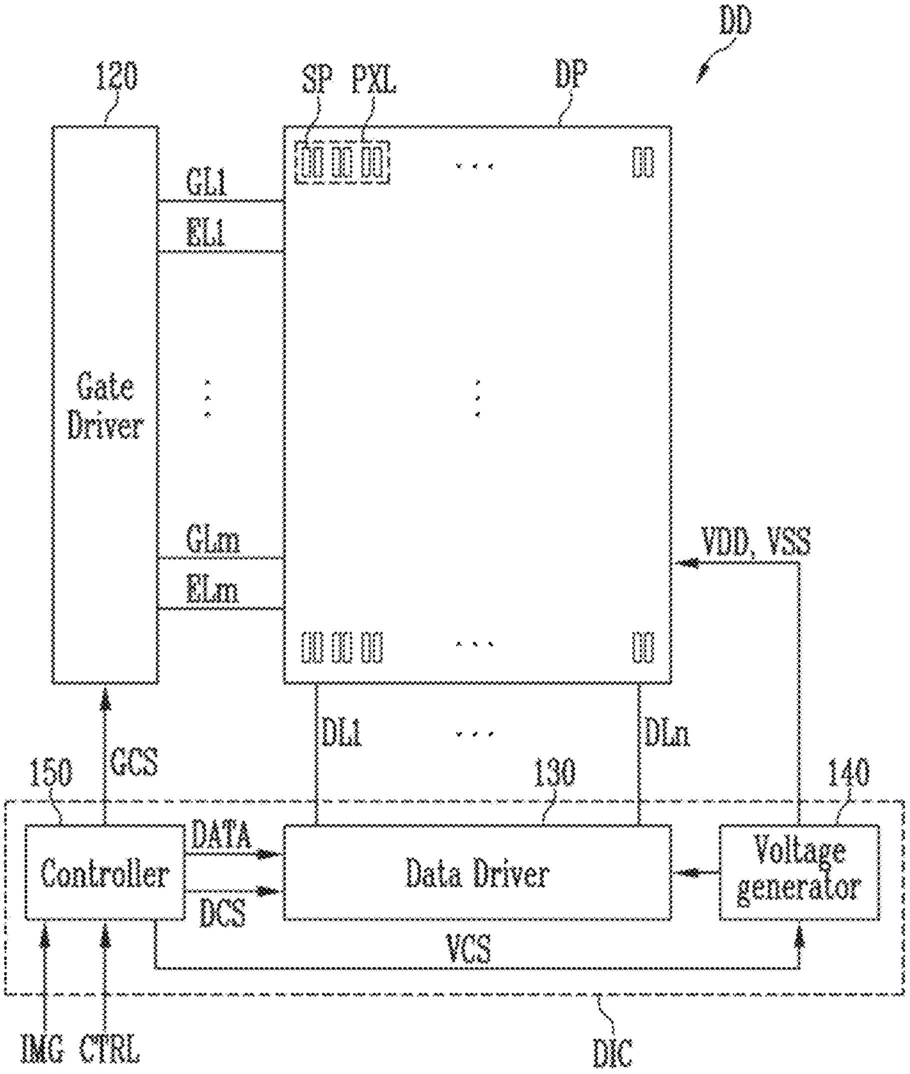
FIG. 1 is a block diagram illustrating a display device according to an embodiment of the present invention.

Hereinafter, embodiments of the present invention will be described in more detail with reference to the accompanying drawings. In addition, the present invention is not limited to the embodiments described herein and may be embodied in other forms.

Throughout the specification, in a case where a portion is "connected" to another portion, the case includes not only a case where the portion is "directly connected" but also a case where the portion is "indirectly connected" with another element interposed therebetween. "At least any one of X, Y, and Z" and "at least any one selected from a group consisting of X, Y, and Z" may be interpreted as one X, one Y, one Z, or any combination of two or more of X, Y, and Z (for example, XYZ, XYY, YZ, and ZZ). Here, "and/or" includes all combinations of one or more of corresponding configurations.

Here, terms such as first and second may be used to describe various components, but these components are not limited to these terms. These terms are used to distinguish one component from another component. Therefore, a first component may refer to a second component without departing from the scope of the present invention.

Spatially relative terms such as "under", "on", and the like may be used for descriptive purposes, thereby describing the relationship between one element or feature and another element(s) or feature(s) as shown in the drawings. Spatially relative terms are intended to include other directions in use, in operation, and/or in manufacturing, in addition to the direction depicted in the drawings. For example, when a device shown in the drawing is turned upside down, elements depicted as being positioned "under" other elements or features are positioned in a direction "on" the other elements or features. Therefore, in an embodiment, the term "under" may include both directions of on and under. In addition, the device may face in other directions (for example, rotated 90 degrees or in other directions) and thus the spatially relative terms used herein are interpreted according thereto.

Various embodiments of the present invention are described with reference to drawings schematically illustrating ideal embodiments. Accordingly, it will be expected that shapes may vary, for example, according to tolerances and/or manufacturing techniques. Therefore, the embodiments disclosed herein cannot be construed as being limited to shown specific shapes, and should be interpreted as including, for example, changes in shapes that occur as a result of manufacturing. As described above, the shapes shown in the drawings might not show actual shapes of areas of a device, and the embodiments of the present invention are not limited thereto.

FIG. 1 is a block diagram illustrating a display device according to an embodiment of the present invention.

Referring to FIG. 1, a display device DD may include a display panel DP, a gate driver 120, a data driver 130, a voltage generator 140, and a controller 150.

The display panel DP may include sub-pixels SP. The sub-pixels SP may be connected to the gate driver 120 through first to m-th gate lines GL1 to GLm. The sub-pixels SP may be connected to the data driver 130 through first to n-th data lines DL1 to DLn.

Each of the sub-pixels SP may include at least one light emitting element that is configured to generate light. Accordingly, each of the sub-pixels SP may generate light of a specific color, such as red, green, blue, cyan, magenta, yellow, or the like. As an example, two of the sub-pixels SP may emit light of the same color. Among the sub-pixels SP, six or more sub-pixels may constitute one pixel. For example, as shown in FIG. 1, six sub-pixels may constitute one pixel.

The gate driver 120 may be connected to the sub-pixels SP arranged in a row direction through the first to m-th gate lines GL1 to GLm. The gate driver 120 may output gate signals to the first to m-th gate lines GL1 to GLm in response to a gate control signal GCS. In embodiments of the present invention, the gate control signal GCS may include a start signal indicating the start of each frame, a horizontal synchronization signal for outputting the gate signals in synchronization with the timing at which data signals are applied, and the like.

In embodiments of the present invention, first to m-th emission control lines EL1 to ELm connected to the sub-pixels SP in the row direction may be further provided. In this case, the gate driver 120 may include an emission control driver configured to control the first to m-th emission control lines EL1 to ELm, and the emission control driver may operate under the control of the controller 150.

The gate driver 120 may be disposed on one side of the display panel DP. However, embodiments of the present invention are not limited thereto. For example, the gate driver 120 may be divided into two or more physically and/or logically separated drivers. Such drivers may be disposed on one side of the display panel DP and on the other side of the display panel DP that is opposite to the one side. As such, the gate driver 120 may be disposed around the display panel DP in various forms depending on embodiments.

The data driver 130 may be connected to the sub-pixels SP arranged in a column direction through the first to n-th data lines DL1 to DLn. The data driver 130 may receive image data DATA and a data control signal DCS from the controller 150. The data driver 130 may operate in response to the data control signal DCS. In embodiments of the present invention, the data control signal DCS may include a source start pulse, a source shift clock, a source output enable signal, and the like.

The data driver 130 may apply data signals having grayscale voltages corresponding to the image data DATA to the first to n-th data lines DL1 to DLn by using voltages from the voltage generator 140. When a gate signal is applied to each of the first to m-th gate lines GL1 to GLm, the data signals corresponding to the image data DATA may be applied to the data lines DL1 to DLn. Accordingly, corresponding sub-pixels SP may generate light corresponding to the data signals. Accordingly, an image may be displayed on the display panel DP.

In embodiments of the present invention, the gate driver 120 and data driver 130 may include complementary metal-oxide semiconductor (CMOS) circuit elements.

The voltage generator 140 may operate in response to a voltage control signal VCS from the controller 150. The voltage generator 140 may be configured to generate a plurality of voltages and provide the generated voltages to components of the display device DD. For example, the voltage generator 140 may generate the plurality of voltages by receiving an input voltage from outside the display device DD, adjusting the received voltage, and regulating the adjusted voltage.

The voltage generator 140 may generate a first power source voltage VDD and a second power source voltage VSS. The generated first and second power source voltages VDD and VSS may be provided to the sub-pixels SP. The first power source voltage VDD may have a relatively high voltage level, and the second power source voltage VSS may have a voltage level lower than the first power source voltage VDD. In embodiments of the present invention, the first power source voltage VDD or the second power source voltage VSS may be provided by a device external to the display device DD.

In addition, the voltage generator 140 may generate various voltages. For example, the voltage generator 140 may generate an initialization voltage that is applied to the sub-pixels SP. For example, during a sensing operation to sense electrical characteristics of transistors and/or light emitting elements of the sub-pixels SP, a predetermined reference voltage may be applied to the first to n-th data lines DL1 to DLn. The voltage generator 140 may generate such a reference voltage.

The controller 150 may control various operations of the display device DD. The controller 150 may receive input image data IMG and a control signal CTRL for controlling the display from the outside. The controller 150 may generate the gate control signal GCS, the data control signal DCS, and the voltage control signal VCS in response to the control signal CTRL.

The controller 150 may convert the input image data IMG to suit the display device DD or display panel DP and may output the image data DATA. In embodiments of the present invention, the controller 150 may output the image data DATA by rearranging the input image data IMG to fit the sub-pixels SP in row units.

Two or more components of the data driver 130, the voltage generator 140, and the controller 150 may be mounted on one integrated circuit; however, the present invention is not limited thereto. As shown in FIG. 1, the data driver 130, the voltage generator 140, and the controller 150 may be included in a driver integrated circuit DIC. In this case, the data driver 130, the voltage generator 140, and the controller 150 may be functionally separate components within one driver integrated circuit DIC. In embodiments of the present invention, at least one of the data driver 130, the voltage generator 140, or the controller 150 may be provided as a separate component from the driver integrated circuit DIC.

Figure 2:
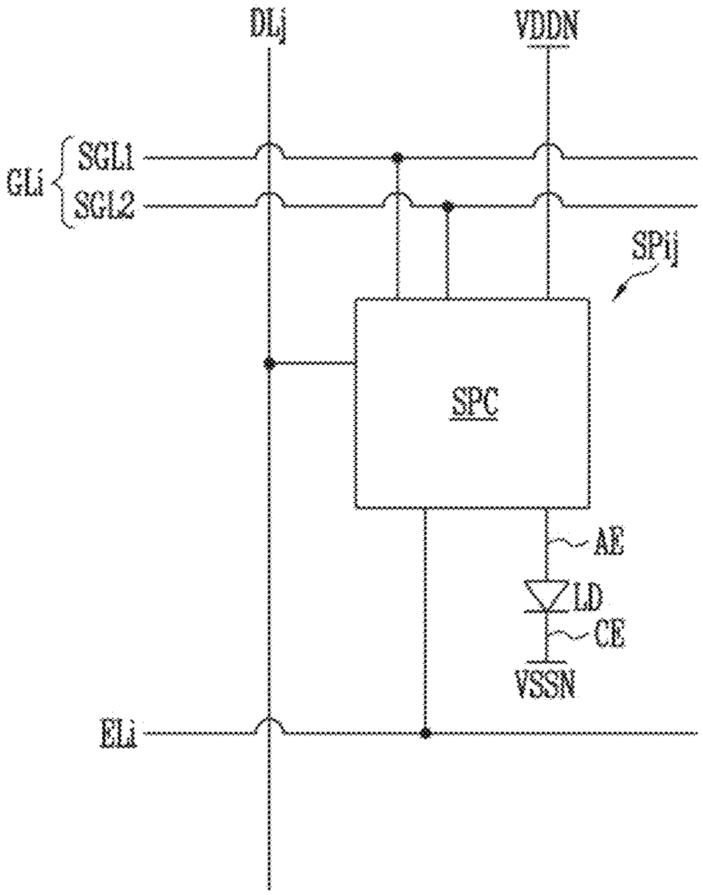
FIG. 2 is a block diagram illustrating one of the sub-pixels of FIG. 1 according to an embodiment of the present invention.

FIG. 2 is a block diagram illustrating one of the sub-pixels of FIG. 1 according to an embodiment of the present invention. In FIG. 2, among the sub-pixels SP of FIG. 1, a sub-pixel SPij located in an i-th row (i may be an integer greater than or equal to 1 and less than or equal to m) and a j-th column (j may be an integer greater than or equal to 1 and less than or equal to n) is shown as an example.

Referring to FIG. 2, the sub-pixel SPij may include a sub-pixel circuit SPC and a light emitting element LD.

The light emitting element LD may be connected between a first power source voltage node VDDN and a second power source voltage node VSSN. In this case, the first power source voltage node VDDN may be a node that transmits the first power source voltage VDD of FIG. 1, and the second power source voltage node VSSN may be a node that transmits the second power source voltage VSS of FIG. 1.

An anode electrode AE of the light emitting element LD may be connected to the first power source voltage node VDDN through the sub-pixel circuit SPC, and a cathode electrode CE of the light emitting element LD may be connected to the second power source voltage node VSSN. For example, the anode electrode AE of the light emitting element LD may be connected to the first power source voltage node VDDN through one or more transistors that are included in the sub-pixel circuit SPC.

The sub-pixel circuit SPC may be connected to an i-th gate line GLi among the first to m-th gate lines GL1 to GLm of FIG. 1. An i-th emission control line EL1 among the first to m-th emission control lines EL1 to ELm of FIG. 1, and a j-th data line DLj among the first to n-th data lines DL1 to DLn of FIG. 1. The sub-pixel circuit SPC may be configured to control the light emitting element LD according to signals that are received through these signal lines.

The sub-pixel circuit SPC may operate in response to a gate signal received through the i-th gate line GLi. The i-th gate line GLi may include one or more sub-gate lines. In embodiments of the present invention, as shown in FIG. 2, the i-th gate line GLi may include first and second sub-gate lines SGL1 and SGL2. The sub-pixel circuit SPC may operate in response to gate signals that are received through the first and second sub-gate lines SGL1 and SGL2. As such, when the i-th gate line GLi includes two or more sub-gate lines, the sub-pixel circuit SPC may operate in response to gate signals that are received through corresponding sub-gate lines.

The sub-pixel circuit SPC may operate in response to an emission control signal that is received through the i-th emission control line ELi. In embodiments of the present invention, the i-th emission control line EL1 may include one or more sub-emission control lines. When the i-th emission control line EL1 includes two or more sub-emission control lines, the sub-pixel circuit SPC may operate in response to emission control signals that are received through corresponding sub-emission control lines.

The sub-pixel circuit SPC may receive a data signal through the j-th data line DLj. The sub-pixel circuit SPC may store a voltage corresponding to the data signal in response to at least one of the gate signals received through the first and second sub-gate lines SGL1 and SGL2. The sub-pixel circuit SPC may adjust a current flowing from the first power source voltage node VDDN to the second power source voltage node VSSN through the light emitting element LD according to the stored voltage in response to the emission control signal that is received through the i-th emission control line Eli. Accordingly, the light emitting element LD may generate light with a luminance corresponding to the data signal.

Figure 3:
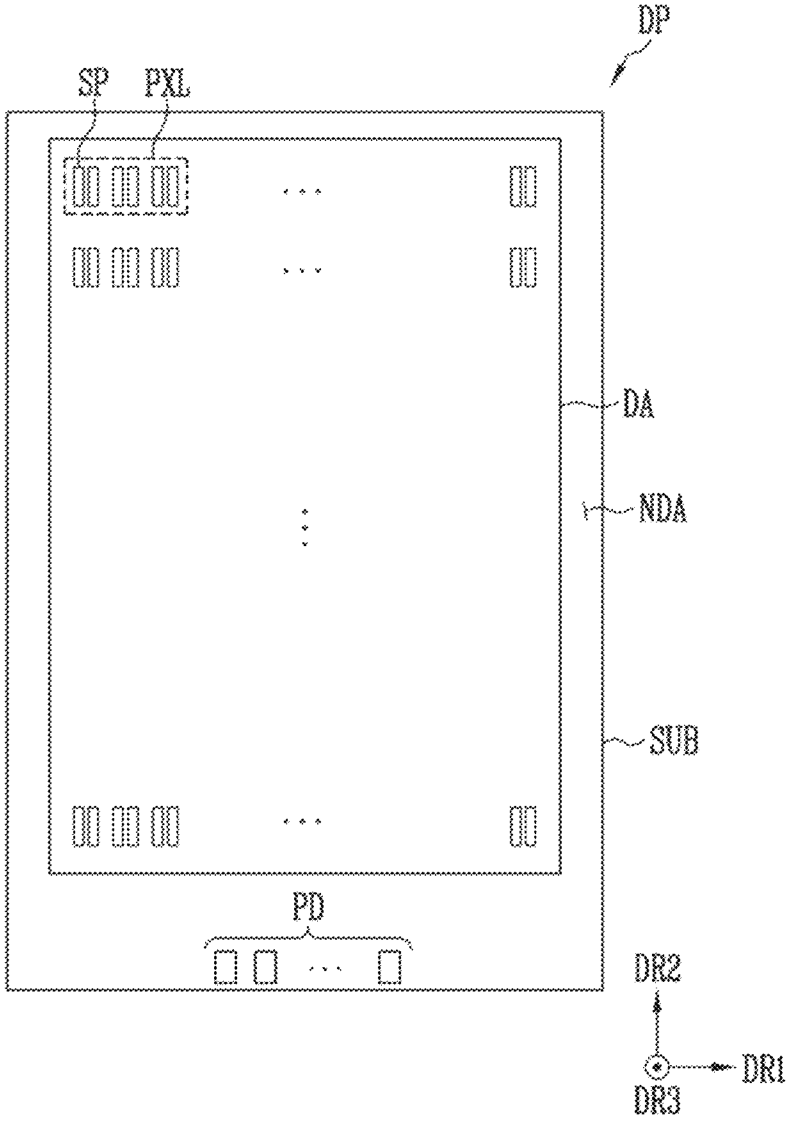
FIG. 3 is a plan view illustrating a display panel of FIG. 1 according to an embodiment of the present invention.

FIG. 3 is a plan view illustrating a display panel of FIG. 1, according to an embodiment of the present invention.

Referring to FIG. 3, the display panel DP of FIG. 1 may include a display area DA and a non-display area NDA. The display panel DP may display an image through the display area DA. The non-display area NDA may be disposed adjacent to the display area DA.

The display panel DP may include a substrate SUB, the sub-pixels SP, and pads PD.

The sub-pixels SP may be disposed in the display area DA of the substrate SUB. The sub-pixels SP may be arranged in a matrix form along a first direction DR1 and a second direction DR2 intersecting the first direction DR1. However, embodiments of the present invention are not limited thereto. For example, the sub-pixels SP may be arranged in a zigzag shape or an alternating arrangement along the first direction DR1 and the second direction DR2. For example, the sub-pixels SP may be arranged in a PENTILE™ shape. For example, the first direction DR1 may be a row direction, and the second direction DR2 may be a column direction.

As an example, two of the sub-pixels SP may emit light of the same color. Among the sub-pixels SP, six or more sub-pixels may constitute one pixel. For example, one pixel may include a first sub-pixel and a second sub-pixel that emit light of a first color, a third sub-pixel and a fourth sub-pixel that emit light of a second color, and a fifth sub-pixel and a sixth sub-pixel that emit light of a third color.

Components for controlling the sub-pixels SP may be disposed in the non-display area NDA of the substrate SUB. For example, wirings connected to the sub-pixels SP, such as the first to m-th gate lines GL1 to GLm and the first to n-th data lines DL1 to DLn of FIG. 1, may be disposed in the non-display area NDA.

At least one of the gate driver 120, the data driver 130, the voltage generator 140, and the controller 150 of FIG. 1 may be integrated in the non-display area NDA of the display panel DP. In embodiments of the present invention, the gate driver 120 of FIG. 1 may be mounted on the display panel DP, but may be disposed in the non-display area NDA. In embodiments of the present invention, the gate driver 120 may be implemented as an integrated circuit that is separate from the display panel DP.

The pads PD may be disposed in the non-display area NDA of the substrate SUB. The pads PD may be electrically connected to the sub-pixels SP through the wirings. For example, the pads PD may be connected to the sub-pixels SP through the first to n-th data lines DL1 to DLn.

The pads PD may interface the display panel DP to other components of the display device 100 (see FIG. 1). For example, the pads PD may enable a transfer of signals between the display panel DP and an external device. In embodiments of the present invention, voltages and signals for the operation of components included in the display panel DP may be provided from the driver integrated circuit DIC of FIG. 1 through the pads PD. For example, the first to n-th data lines DL1 to DLn may be connected to the driver integrated circuit DIC through the pads PD. For example, the display panel DP may receive the first and second power source voltages VDD and VSS from the driver integrated circuit DIC through the pads PD. For example, when the gate driver 120 is mounted on the display panel DP, the gate control signal GCS may be transmitted from the driver integrated circuit DIC to the gate driver 120 through the pads PD.

In embodiments of the present invention, a circuit board may be electrically connected to the pads PD by using a conductive adhesive member such as an anisotropic conductive film. In this case, the circuit board may be a flexible circuit board (FPCB) or a flexible film made of a flexible material. The driver integrated circuit DIC may be mounted on the circuit board and electrically connected to the pads PD.

In embodiments of the present invention, the display area DA may have various shapes. The display area DA may have a closed loop shape including straight and/or curved sides. For example, the display area DA may have a shape such as a polygon, circle, semicircle, or oval.

In embodiments of the present invention, the display panel DP may have a flat display surface. In embodiments of the present invention, the display panel DP may have a display surface that is at least partially round. In embodiments of the present invention, the display panel DP may be bent, folded, or rolled. In these cases, the display panel DP and/or the substrate SUB may include materials with flexible properties.

Figure 4:
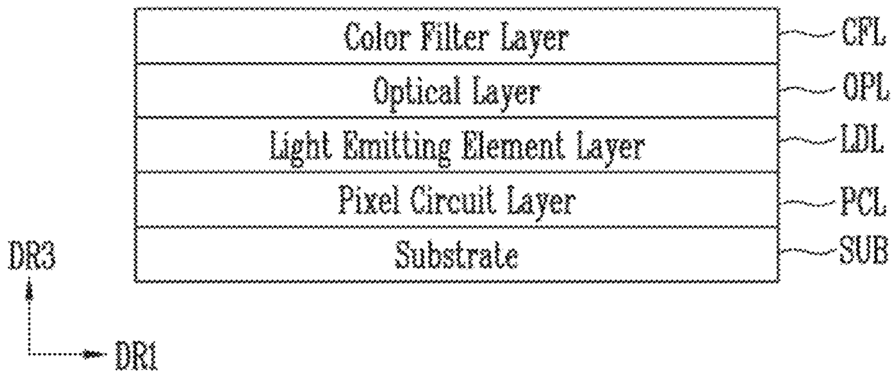
FIG. 4 is a cross-sectional view illustrating the display panel of FIG. 1 according to an embodiment of the present invention.

FIG. 4 is a cross-sectional view illustrating the display panel of FIG. 1 according to an embodiment of the present invention.

Referring to FIG. 4, the display panel DP may include a substrate SUB, a pixel circuit layer PCL, a light emitting element layer LDL, an optical layer OPL, and a color filter layer CFL.

The pixel circuit layer PCL may be disposed on the substrate SUB. The pixel circuit layer PCL may include circuit elements of the sub-pixel circuit SPC (see FIG. 2) and at least one insulating layer disposed between the circuit elements. The circuit elements may include a plurality of transistors and signal lines that are connected to the transistors. As an example, the transistors may be MOSFETs (Metal Oxide Semiconductor Field Effect Transistors), but the present invention is not limited thereto. In addition, each of the transistors may have a structure in which a semiconductor layer, a gate electrode, and source/drain electrodes are sequentially stacked with an insulating layer interposed between each of the elements.

The above-described substrate SUB and pixel circuit layer PCL may be formed by applying semiconductor processes and equipment, but the present invention is not limited thereto.

The light emitting element layer LDL may include light emitting elements LD (see FIG. 6) that emit light. The light emitting elements LD may be disposed in first to sixth sub-pixels SP1 to SP6 (see FIG. 6), respectively. In an embodiment of the present invention, the light emitting elements LD may emit light of the same color. In this case, due to color filters, which have different colors from each other, being disposed on the light emitting elements LD, the first to sixth sub-pixels SP1 to SP6 may emit light of different colors. In an embodiment of the present invention, the light emitting elements LD may emit light of different colors. However, the color of light that is emitted from the light emitting elements LD is not limited thereto.

The optical layer OPL may be disposed on the light emitting element layer LDL. Light emitted from the light emitting element layer LDL may be provided to the optical layer OPL, and the optical layer OPL may refract and emit the light that is provided from the light emitting element layer LDL. For example, the optical layer OPL may include prism patterns PRP (see FIG. 6) that can change an emission angle of the light that is emitted from the light emitting element layer LDL. The optical layer OPL may be formed through a continuous process on a base surface provided by the light emitting element layer LDL. A more specific configuration of the optical layer OPL will be described in detail below.

The color filter layer CFL may be disposed on the optical layer OPL. The color filter layer CFL may include color filters that selectively transmit light of one color. For example, the color filter layer CFL may selectively transmit the light emitted from each of the light emitting elements LD in an image display direction (or front direction) of the display panel DP, but the present invention is not limited thereto.

Figure 5:
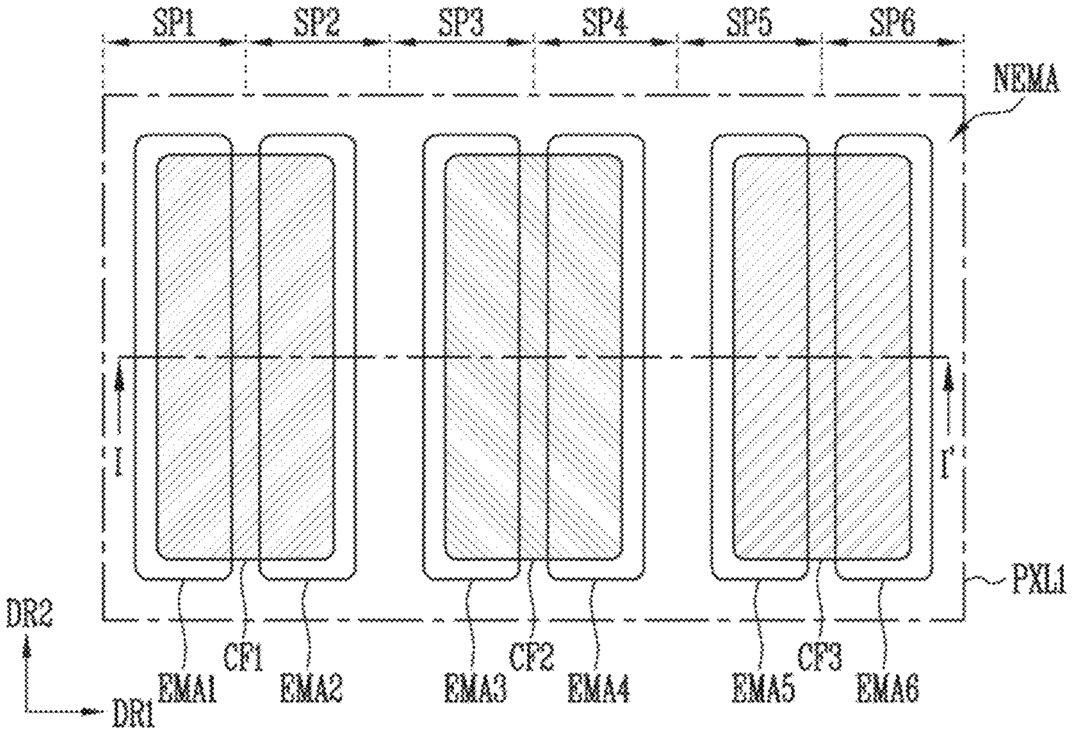
FIG. 5 is a plan view illustrating one of the pixels of FIG. 3 according to an embodiment of the present invention.

FIG. 5 is a plan view illustrating one of the pixels of FIG. 3 according to an embodiment of the present invention. In FIG. 5, for clear and concise description, one of pixels PXL of FIG. 3 is schematically shown as a first pixel PXL1. The remaining pixels may be configured similarly to the first pixel PXL1.

Referring to FIG. 5, the first pixel PXL1 may include first to sixth sub-pixels SP1 to SP6 arranged in the first direction DR1. First to sixth pixels PXL1 to PXL6 may be arranged in various structures (for example, a stripe structure, a PENTILET$^{M}$ structure, or the like) and are not limited to the structure shown in FIG. 5.

Each of the first to sixth pixels PXL1 to PXL6 may include a light emitting element that emits light and circuit elements for driving the light emitting element.

The first sub-pixel SP1 may include a first emission area EMA1 and a non-emission area NEMA around the first emission area EMAL. For example, the non-emission area NEMA is disposed adjacent to the first emission area EMAL. The first emission area EMA1 may be an area where light is emitted from a light emitting element LD1 (see FIG. 6) that is driven by circuit elements of the first sub-pixel SP1. The first emission area EMA1 may be an area where light of a first color (for example, red) is emitted. The second sub-pixel SP2 may include a second emission area EMA2 and a non-emission area NEMA around the second emission area EMA2. The second emission area EMA2 may be an area where light is emitted from a light emitting element LD2 (see FIG. 6) that is driven by circuit elements of the second sub-pixel SP2. The second emission area EMA2 may be an area where light of the first color is emitted, like the first emission area EMAL.

The third sub-pixel SP3 may include a third emission area EMA3 and a non-emission area NEMA around the third emission area EMA3. The third emission area EMA3 may be an area where light is emitted from a light emitting element LD3 (see FIG. 6) that is driven by circuit elements of the third sub-pixel SP3. The third emission area EMA3 may be an area where light of a second color (for example, green) is emitted. The fourth sub-pixel SP4 may include a fourth emission area EMA4 and a non-emission area NEMA around the fourth emission area EMA4. The fourth emission area EMA4 may be an area where light is emitted from a light emitting element LD4 (see FIG. 6) that is driven by circuit elements of the fourth sub-pixel SP4. The fourth emission area EMA4 may be an area where light of the second color is emitted, like the third emission area EMA3.

The fifth sub-pixel SP5 may include a fifth emission area EMA5 and a non-emission area NEMA around the fifth emission area EMA5. The fifth emission area EMA5 may be an area where light is emitted from a light emitting element LD5 (see FIG. 6) that is driven by circuit elements of the fifth sub-pixel SP5. The fifth emission area EMA5 may be an area where light of a third color (for example, blue) is emitted. The sixth sub-pixel SP6 may include a sixth emission area EMA6 and a non-emission area NEMA around the sixth emission area EMA6. The sixth emission area EMA6 may be an area where light is emitted from a light emitting element LD6 (see FIG. 6) that is driven by circuit elements of the sixth sub-pixel SP6. The sixth emission area EMA6 may be an area where light of the third color is emitted, like the fifth emission area EMA5.

As described with reference to FIG. 5, an emission area may be understood as an area overlapping with a light emitting element corresponding to each of the first to sixth sub-pixels SP1 to SP6.

The first pixel PXL1 may include first to third color filters CF1 to CF3. The first to third color filters CF1 to CF3 may be formed in the same process as each other and may be disposed in the same layer. In addition, the first to third color filters CF1 to CF3 may be arranged to be spaced apart from each other. For example, the first and second color filters CF1 and CF2 may be arranged to be spaced apart from each other with a light blocking pattern interposed therebetween. In addition, the second and third color filters CF2 and CF3 may be arranged to be spaced apart from each other with a light blocking pattern interposed therebetween.

The first color filter CF1 may overlap the first and second emission areas EMA1 and EMA2 when viewed on a plane. The first color filter CF1 may be disposed in between the first and second emission areas EMA1 and EMA2. For example, the first color filter CF1 may overlap an area that is between the first and second emission areas EMA1 and EMA2. In addition, when viewed on a plane, an area of the first color filter CF1 may be smaller than or equal to areas of the first and second emission areas EMA1 and EMA2. For example, an area of the first color filter CF1 may be smaller than or equal to a combined area of the first and second emission areas EMA1 and EMA2.

The second color filter CF2 may overlap the third and fourth emission areas EMA3 and EMA4 when viewed on a plane. The second color filter CF2 may be disposed in between the third and fourth emission areas EMA3 and EMA4. For example, the second color filter CF2 may overlap an area that is between the third and fourth emission areas EMA3 and EMA4. In addition, when viewed on a plane, an area of the second color filter CF2 may be smaller than or equal to areas of the third and fourth emission areas EMA3 and EMA4. For example, an area of the second color filter CF2 may be smaller than or equal to a combined area of the third and fourth emission areas EMA3 and EMA4.

The third color filter CF3 may overlap the fifth and sixth emission areas EMA5 and EMA6 when viewed on a plane. The third color filter CF3 may be disposed in between the fifth and sixth emission areas EMA5 and EMA6. For example, the third color filter CF3 may overlap an area that is between the fifth and sixth emission areas EMA5 and EMA6. In addition, when viewed on a plane, an area of the third color filter CF3 may be smaller than or equal to areas of the fifth and sixth emission areas EMA5 and EMA6. For example, an area of the third color filter CF3 may be smaller than or equal to a combined area of the fifth and sixth emission areas EMA5 and EMA6.

As such, each pixel PXL (see FIG. 1) may include two sub-pixels that emit light of the same color. By selectively (or time-divisively) driving two sub-pixels that emit light of the same color in each pixel, the display device DD (see FIG. 1) may provide different images at specific angles.

Figure 6:
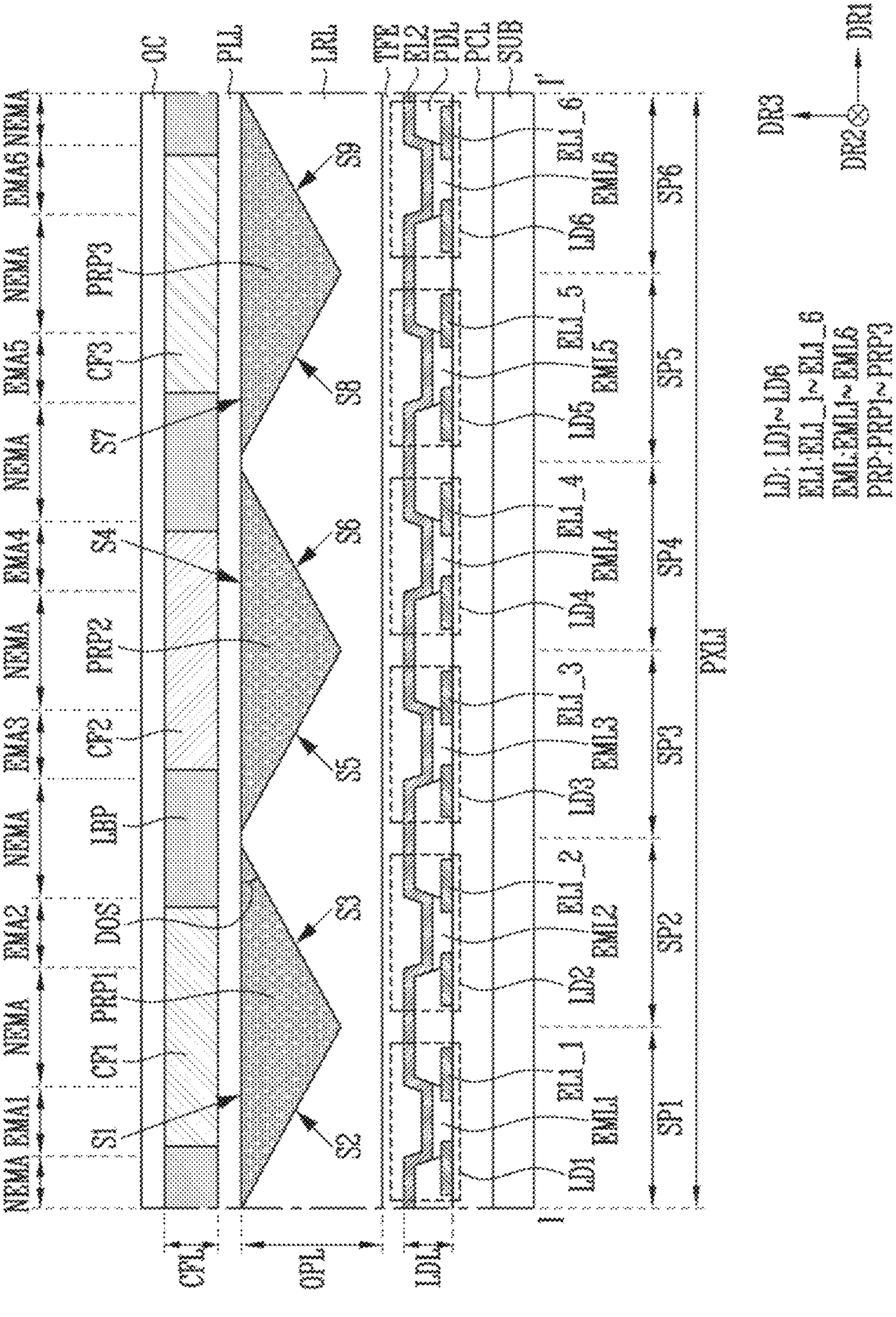
FIG. 6 is a cross-sectional view taken along line I-I' of FIG. 5.

FIG. 6 is a cross-sectional view taken along line I-I' of FIG. 5.

Referring to FIG. 6, the first pixel PXL1 may include the substrate SUB, the pixel circuit layer PCL, the light emitting element layer LDL, a thin film encapsulation layer TFE, the optical layer OPL, and the color filter layer CFL.

The light emitting element layer LDL including the first to sixth light emitting elements LD1 to LD6 may be disposed on the substrate SUB. In addition, the pixel circuit layer PCL may be disposed between the substrate SUB and the light emitting element layer LDL.

The pixel circuit layer PCL may include various driving elements, wirings, and the like for driving the first to sixth light emitting elements LD1 to LD6. For example, the pixel circuit layer PCL may include transistors and storage capacitors included in the sub-pixel circuit SPC (see FIG. 2) of each of the first to sixth sub-pixels SP1 to SP6. For example, the pixel circuit layer PCL may further include wirings such as scan lines and data lines connected to the first to sixth sub-pixels SP1 to SP6 of each pixel. In addition, the pixel circuit layer PCL may include various components, and embodiments of the present invention are not limited thereto.

The light emitting element layer LDL may include the first light emitting element LD1, the second light emitting element LD2, the third light emitting element LD3, the fourth light emitting element LD4, the fifth light emitting element LD5, and the sixth light emitting element LD6. The first light emitting element LD1 is located in the first sub-pixel SP1. The second light emitting element LD2 is located in the second sub-pixel SP2. The third light emitting element LD3 is located in the third sub-pixel SP3. The fourth light emitting element LD4 is located in the fourth sub-pixel SP4. The fifth light emitting element LD5 is located in the fifth sub-pixel SP5, and the sixth light emitting element LD6 is located in the sixth sub-pixel SP6.

According to one embodiment of the present invention, each of the first to sixth light emitting elements LD1 to LD6 may include a self-light emitting element such as an organic light emitting diode. For example, each of the first to sixth light emitting elements LD1 to LD6 may have a structure in which the anode electrode AE (see FIG. 2), a hole transport layer, an organic light emitting layer, an electron transport layer, and the cathode electrode CE (see FIG. 2) are sequentially stacked, but the present invention is not limited thereto. For example, each of the first to sixth light emitting elements LD1 to LD6 may include an inorganic light emitting element including an inorganic light emitting material.

According to one embodiment of the present invention, first electrodes EL1 (for example, anode electrodes) may be formed to be patterned in each of the first to sixth sub-pixels SP1 to SP6. Since the first electrodes EL1 supply holes to an organic light emitting layer EML, the first electrodes EL1 may be made of a transparent conductive material with a high work function. For example, the first electrodes EL1 may be made of a transparent conductive material such as tin oxide (TO), zinc oxide (ZnO), indium tin oxide (ITO), indium zinc oxide (IZO), and indium tin zinc oxide (ITZO), but the present invention is not limited thereto.

The organic light emitting layer EML may be disposed between the first electrodes EL1 and a second electrode EL2 (for example, cathode electrode). Light may be emitted as electrons and holes supplied from the first electrode EL1 and the second electrode EL2 combine with each other in the organic light emitting layer EML.

The second electrode EL2 may be disposed on the organic light emitting layer EML. The second electrode EL2 may be formed as one layer over the surface of the substrate SUB. For example, the second electrode EL2 may be formed as one layer over the entire surface of the substrate SUB. The second electrode EL2 of each of the first to sixth sub-pixels SP1 to SP6 may be connected to each other and formed as one body. Since the second electrode EL2 supplies electrons to the organic light emitting layer EML, the second electrode EL2 may include a conductive material with a low work function. For example, the second electrode EL2 may be made of a transparent conductive material such as tin oxide (TO), zinc oxide (ZnO), indium tin oxide (ITO), indium zinc oxide (IZO), and indium tin zinc oxide (ITZO), or ytterbium (Yb) alloy. In addition, the second electrode EL2 may be made of a metal material such as silver (Ag), copper (Cu), and magnesium-silver (Mg—Ag) alloy, or a very thin metal material, but the present invention is not limited thereto.

The thin film encapsulation layer TFE may be disposed on the light emitting element layer LDL. The thin film encapsulation layer TFE may be an encapsulation substrate or may be in the form of an encapsulation film made of a multilayer film structure. When the thin film encapsulation layer TFE is in the form of an encapsulation film, the thin film encapsulation layer TFE may include an inorganic film and/or an organic film. For example, the thin film encapsulation layer TFE may have a structure in which an inorganic film, an organic film, and an inorganic film are sequentially stacked on each other. The thin film encapsulation layer TFE may prevent air and moisture from penetrating into the light emitting element layer LDL and the pixel circuit layer PCL from the outside. However, if necessary, the thin film encapsulation layer TFE may be omitted.

The optical layer OPL may be disposed on the thin film encapsulation layer TFE. The optical layer OPL may include a refractive layer LRL and prism patterns PRP. The optical layer OPL may include resin.

The prism patterns PRP may be arranged in the first direction DR1. Each of the prism patterns PRP may extend in the second direction DR2. The prism patterns PRP may include first to third prism patterns PRP1 to PRP3 in the first pixel PXL1. The first prism pattern PRP1 may be disposed in the first and second sub-pixels SP1 and SP2 and may overlap the first and second light emitting elements LD1 and LD2. The second prism pattern PRP2 may be disposed in the third and fourth sub-pixels SP3 and SP4 and may overlap the third and fourth light emitting elements LD3 and LD4. The third prism pattern PRP3 may be disposed in the fifth and sixth sub-pixels SP5 and SP6 and may overlap the fifth and sixth light emitting elements LD5 and LD6.

Each of the first to third prism patterns PRP1 to PRP3 may have a reversed tapered shape and may be adjacent to the light emitting element layer LDL. Each of the first to third prism patterns PRP1 to PRP3 may have a cross-sectional shape of at least one of an inverted triangle, an inverted trapezoid, and an inverted pentagon. For example, each of the first to third prism patterns PRP1 to PRP3 may have a cross-sectional shape of an inverted triangle as shown in FIG. 6. In this case, each of the first to third prism patterns PRP1 to PRP3 may have symmetrical lower surfaces that meet each other. For example, the lower surfaces of the first to third prism patterns PRP1 and PRP3 may be substantially coplanar.

As an example, the first prism pattern PRP1 may include a first surface S1 that is adjacent to the color filter layer CFL but overlapping the first and second light emitting elements LD1 and LD2. The first prism pattern PRP1 may be adjacent to the light emitting element layer LDL but may extend from one side of the first surface S1 in a diagonal direction that extends between the first direction DR1 and a direction opposite to a third direction DR3. The first prism pattern PRP1 may include a second surface S2 extending from the one side of the first surface S1 and overlapping the first light emitting element LD1. The first prism pattern PRP1 may be adjacent to the light emitting element layer LDL but may extend from the other side of the first surface S1 in a diagonal direction that extends between a direction opposite to the first direction DR1 and the direction opposite to the third direction DR3. The first prism pattern PRP1 may include a third surface S3 extending from the other side of the first surface S1 and overlapping the second light emitting element LD2. Here, the second surface S2 and the third surface S3 may be the lower surfaces of the first prism pattern PRP1 and may have shapes that are symmetrical to each other. The second surface S2 and the third surface S3 may be inclined surfaces having a slope DOS in the range of about 30 degrees to about 50 degrees from the first surface S1. For example, the second surface S2 and the third surface S3 may extend toward each other to contact each other.

The second prism pattern PRP2 may include a fourth surface S4 adjacent to the color filter layer CFL but overlapping the third and fourth light emitting elements LD3 and LD4. The second prism pattern PRP2 may be adjacent to the light emitting element layer LDL but may extend from one side of the fourth surface S4 in a diagonal direction that extends between the first direction DR1 and the direction opposite to the third direction DR3. The second prism pattern PRP2 may include a fifth surface S5 extending from one side of the fourth surface S4 and overlapping the third light emitting element LD3. The second prism pattern PRP2 may be adjacent to the light emitting element layer LDL but may extend from the other side of the fourth surface S4 in a diagonal direction that extends between the direction opposite to the first direction DR1 and the direction opposite to the third direction DR3. The second prism pattern PRP2 may include a sixth surface S6 extending from the other side of the fourth surface S4 and overlapping the fourth light emitting element LD4. Here, the fifth surface S5 and the sixth surface S6 may be the lower surfaces of the second prism pattern PRP2 and may have shapes that are symmetrical to each other. The fifth surface S5 and the sixth surface S6 may be inclined surfaces having a slope DOS in the range of about 30 degrees to about 50 degrees from the fourth surface S4. For example, the fifth surface S5 and the sixth surface S6 may extend toward each other to contact each other.

The third prism pattern PRP3 may include a seventh surface S7 adjacent to the color filter layer CFL but overlapping the fifth and sixth light emitting elements LD5 and LD6. The third prism pattern PRP3 may be adjacent to the light emitting element layer LDL but may extend from one side of the seventh surface S7 in a diagonal direction that extends between the first direction DR1 and the direction opposite to the third direction DR3. The third prism pattern PRP3 may include an eighth surface S8 extending from one side of the seventh surface S7 and overlapping the fifth light emitting element LD5. The third prism pattern PRP3 may be adjacent to the light emitting element layer LDL but may extend from the other side of the seventh surface S7 in a diagonal direction that extends between the direction opposite to the first direction DR1 and the direction opposite to the third direction DR3. The third prism pattern PRP3 may include a ninth surface S9 extending from the other side of the seventh surface S7 and overlapping the sixth light emitting element LD6. Here, the eighth surface S8 and the ninth surface S9 may be the lower surfaces of the third prism pattern PRP3 and may have shapes that are symmetrical to each other. The eighth surface S8 and the ninth surface S9 may be inclined surfaces having a slope DOS in the range of about 30 degrees to about 50 degrees from the seventh surface S7. For example, the eighth surface S8 and the ninth surface S9 may extend toward each other to contact each other.

The prism patterns PRP may refract light emitted from the light emitting element layer LDL and passing through the optical layer OPL. For example, the first prism pattern PRP1 may refract light emitted from the first light emitting element LD1 in a diagonal direction that extends between the first direction DR1 and the third direction DR3. In addition, the first prism pattern PRP1 may refract light emitted from the second light emitting element LD2 in a diagonal direction that extends between the direction opposite to the first direction DR1 and the third direction DR3. For example, two lights refracted through the first prism pattern PRP1 may proceed in directions that are symmetrical to each other.

The refractive layer LRL may be disposed between the prism patterns PRP and the light emitting element layer LDL to cover the lower surfaces of the prism patterns PRP. An upper surface of the refractive layer LRL in contact with the prism patterns PRP may have a shape complementary to the lower surfaces of the prism patterns PRP. The refractive index of the refractive layer LRL may be lower than that of the prism patterns PRP. For example, the refractive layer LRL may be a low refractive index layer having a refractive index of less than about 1.4. In addition, the prism patterns PRP may have a refractive index of about 1.4 or more.

In this way, due to a difference in refractive index between the refractive layer LRL and the prism patterns PRP, light may be refracted at an interface between the refractive layer LRL and the prism patterns PRP and may be output in a direction different from an incident direction. In this case, the prism patterns PRP may have a smaller thickness as the difference between the refractive index of the refractive layer LRL and the refractive index of the prism patterns PRP increases.

A planarization layer PLL may be disposed on the optical layer OPL. The planarization layer PLL may be disposed between the optical layer OPL and the color filter layer CFL. The planarization layer PLL may reduce a step difference caused by components disposed underneath the planarization layer PLL. For example, the planarization layer PLL may include an organic insulating film.

The color filter layer CFL may be disposed on the planarization layer PLL. The color filter layer CFL may include the first to third color filters CF1 to CF3 arranged in the first direction DR1. The first color filter CF1 may be disposed in the first and second sub-pixels SP1 and SP2. The second color filter CF2 may be disposed in the third and fourth sub-pixels SP3 and SP4. The third color filter CF3 may be disposed in the fifth and sixth sub-pixels SP5 and SP6.

As an example, the first color filter CF1 may overlap the first prism pattern PRP1 that is disposed on the first and second light emitting elements LD1 and LD2. An area of the first color filter CF1 may be smaller than or equal to an area of the first prism pattern PRP1. The second color filter CF2 may overlap the second prism pattern PRP2 that is disposed on the third and fourth light emitting elements LD3 and LD4. An area of the second color filter CF2 may be smaller than or equal to an area of the second prism pattern PRP2. The third color filter CF3 may overlap the third prism pattern PRP3 that is disposed on the fifth and sixth light emitting elements LD5 and LD6. An area of the third color filter CF3 may be smaller than or equal to an area of the third prism pattern PRP3.

The colors of the first to third color filters CF1 to CF3 may correspond to the colors of light emitted from the first to sixth sub-pixels SP1 to SP6. For example, the first color filter CF1 may correspond to red light emitted from the first and second sub-pixels SP1 and SP2. The first color filter CF1 may be a red color filter and may include a red color filter material (for example, pigment or dye). The second color filter CF2 may correspond to green light emitted from the third and fourth sub-pixels SP3 and SP4. For example, the second color filter CF2 may be a green color filter and may include a green color filter material (for example, pigment or dye). The third color filter CF3 may correspond to blue light emitted from the fifth and sixth sub-pixels SP5 and SP6. The third color filter CF3 may be a blue color filter and may include a blue color filter material (for example, pigment or dye).

The color filter layer CFL may further include light blocking patterns LBP disposed between the color filters CF. It may be understood that the emission areas (or light emitting areas) EMA1 to EMA6 and the non-emission area NEMA for the first to sixth sub-pixels SP1 to SP6 are defined by the light blocking patterns LBP. The light blocking patterns LBP may overlap the non-emission area NEMA.

In embodiments of the present invention, the light blocking patterns LBP may include at least one of various types of light blocking materials. In embodiments of the present invention, each of the light blocking patterns LBP may be provided in the form of a multi-layer in which at least two color filters among the first to third color filters CF1 to CF3 overlap each other. For example, each of the light blocking patterns LBP may be formed by overlapping the first to third color filters CF1 to CF3. As an example, among the light blocking patterns LBP, a light blocking pattern between the first and second color filters CF1 and CF2 may be formed as a multi-layer structure in which the first and second color filters CF1 and CF2 overlap each other. In addition, among the light blocking patterns LBP, a light blocking pattern between the second and third color filters CF2 and CF3 may be formed as a multi-layer structure in which the second and third color filters CF2 and CF3 overlap each other. A light blocking pattern between the first color filter CF1 and the third color filter CF3 of a neighboring pixel may be formed as a multi-layer in which the first and third color filters CF1 and CF3 overlap each other. In this way, each of the first to third color filters CF1 to CF3 may extend to the non-emission area NEMA to form the light blocking patterns LBP.

Figure 7:
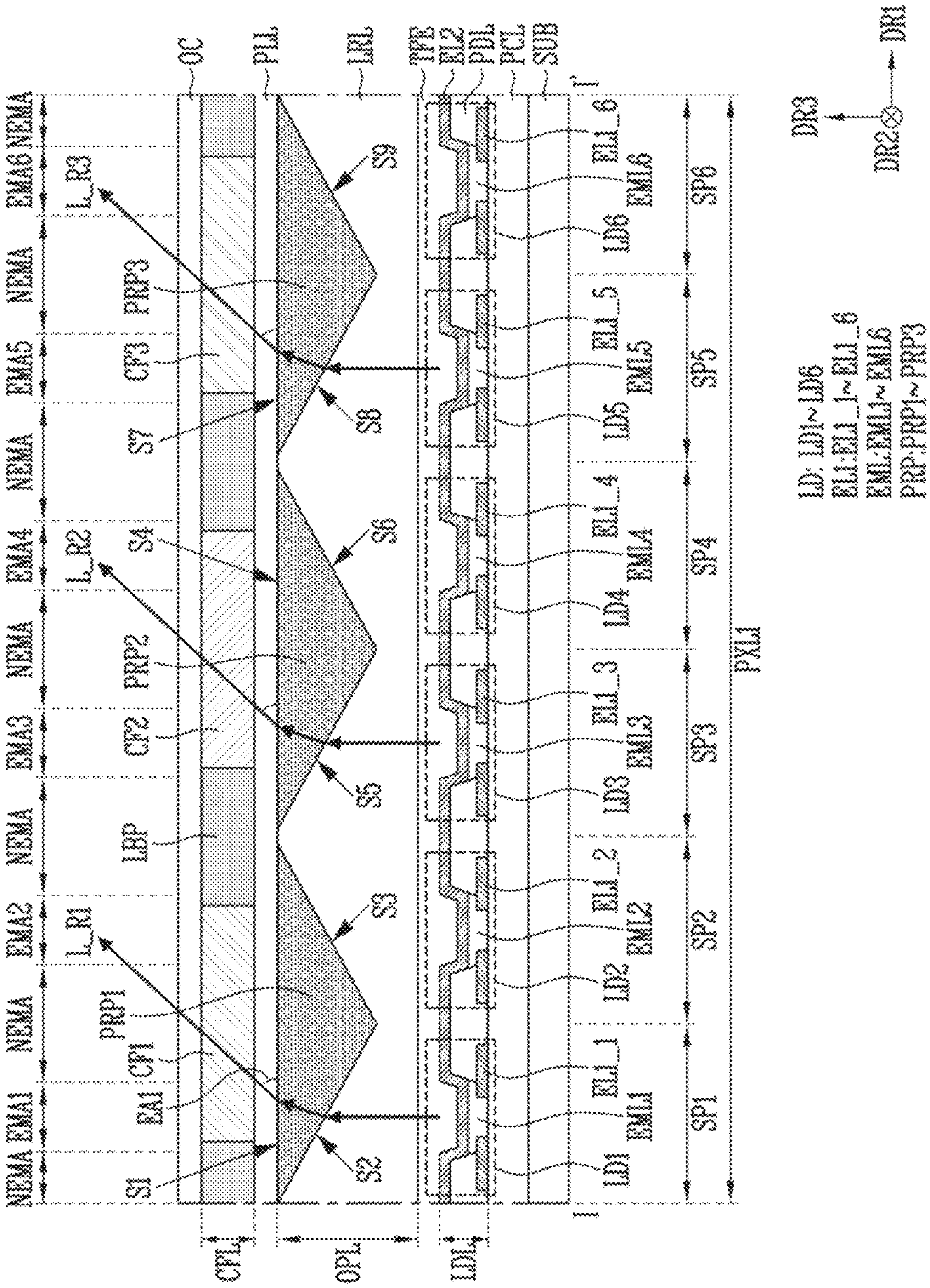
FIG. 7 is a cross-sectional view illustrating a case where a portion of light emitting elements is selected and driven.

FIG. 7 is a cross-sectional view illustrating a case where a portion of light emitting elements is selected and driven.

Referring to FIG. 7, among the first to sixth light emitting elements LD1 to LD6, odd-numbered light emitting elements LD1, LD3, and LD5 may be selectively driven. As an example, each of the odd-numbered light emitting elements LD1, LD3, and LD5 may be a light emitting element that are disposed on the left among light emitting elements that emit light of the same color. For example, among the first and second light emitting elements LD1 and LD2 that emit red light, the first light emitting element LD1 may be selectively driven. Among the third and fourth light emitting elements LD3 and LD4 that emit green light, the third light emitting element LD3 may be selectively driven. Among the fifth and sixth light emitting elements LD5 and LD6 that emit blue light, the fifth light emitting element LD5 may be selectively driven. In this case, the first light emitting element LD1, the third light emitting element LD3, and the fifth light emitting element LD5 may be driven together.

Light L_R1 emitted from the first light emitting element LD1 may pass through the refractive layer LRL and proceed to the inside of the first prism pattern PRP1. The light traveling inside the first prism pattern PRP1 may sequentially pass through the second surface S2 and the first surface S1 and proceed in a diagonal direction that extends between the first direction DR1 and the third direction DR3. For example, the light L_R1 emitted from the first light emitting element LD1 may be refracted on the second surface S2 and the first surface S1 of the first prism pattern PRP1, and may proceed along a path having a first emission angle EA1 based on the first surface S1.

Light L_R2 emitted from the third light emitting element LD3 may pass through the refractive layer LRL and proceed to the inside of the second prism pattern PRP2. The light traveling inside the second prism pattern PRP2 may sequentially pass through the fifth surface S5 and the fourth surface S4 and proceed in a diagonal direction that extends between the first direction DR1 and the third direction DR3. For example, the light L_R2 emitted from the third light emitting element LD3 may be refracted on the fifth surface S5 and the fourth surface S4 of the second prism pattern PRP2, and may proceed along a path having the first emission angle EA1 based on the fourth surface S4.

Light L_R3 emitted from the fifth light emitting element LD5 may pass through the refractive layer LRL and proceed to the inside of the third prism pattern PRP3. The light traveling inside the third prism pattern PRP3 may sequentially pass through the eighth surface S8 and the seventh surface S7 and proceed in a diagonal direction that extends between the first direction DR1 and the third direction DR3. For example, the light L_R3 emitted from the fifth light emitting element LD5 may be refracted on the eighth surface S8 and the seventh surface S7 of the third prism pattern PRP3, and may proceed along a path having the first emission angle EA1 based on the seventh surface S7.

In this way, the light emitted from the first light emitting element LD1, the third light emitting element LD3, and the fifth light emitting element LD5 may pass through the first to third prism patterns PRP1 to PRP3 and proceed in a diagonal direction that extends between the first direction DR1 and the third direction DR3. For example, by operating only the first, third, and fifth light emitting elements LD1, LD3, and LD5 which are alternately arranged with the even numbered light emitting elements LD2, LD4 and LD6 and are each disposed to the left of an even numbered light emitting element LD2, LD4 or LD6, a first image (for example, an image for a driver's seat) can be provided in a right direction. In this case, the left side may be a direction opposite to the first direction DR1, and the right side may be the first direction DR1.

Figure 8:
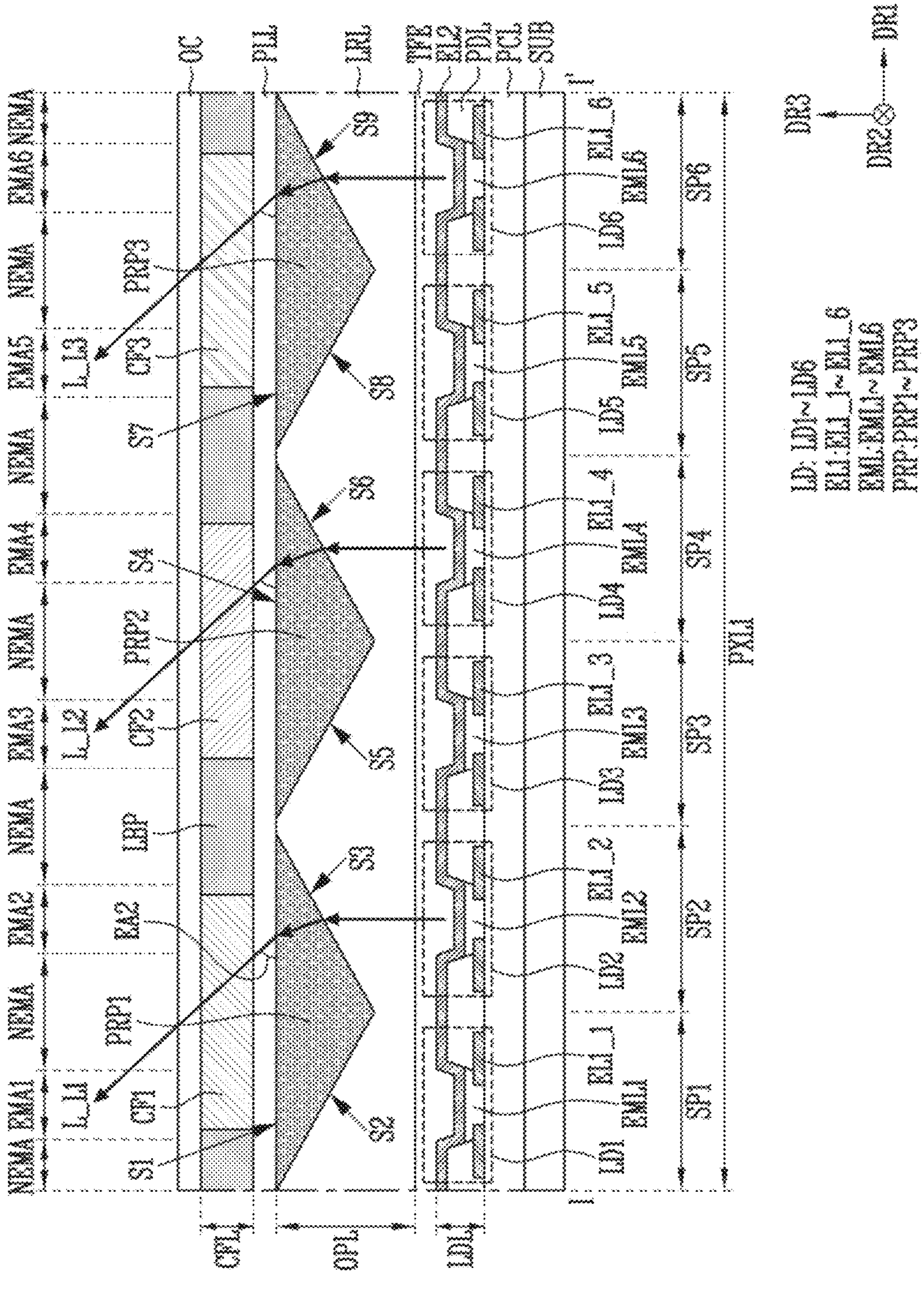
FIG. 8 is a cross-sectional view illustrating a case where another portion of the light emitting elements is selected and driven.

FIG. 8 is a cross-sectional view illustrating a case where another portion of the light emitting elements is selected and driven.

Referring to FIG. 8, among the first to sixth light emitting elements LD1 to LD6, even-numbered light emitting elements LD2, LD4, and LD6 may be selectively driven. As an example, each of the even-numbered light emitting elements LD2, LD4, and LD6 may be a light emitting element disposed on the right among light emitting elements that emit light of the same color. For example, among the first and second light emitting elements LD1 and LD2 that emit red light, the second light emitting element LD2 may be selectively driven. Among the third and fourth light emitting elements LD3 and LD4 that emit green light, the fourth light emitting element LD4 may be selectively driven. Among the fifth and sixth light emitting elements LD5 and LD6 that emit blue light, the sixth light emitting element LD6 may be selectively driven. In this case, the second light emitting element LD2, the fourth light emitting element LD4, and the sixth light emitting element LD6 may be driven together.

Light L_L1 emitted from the second light emitting element LD2 may pass through the refractive layer LRL and proceed to the inside of the first prism pattern PRP1. The light traveling inside the first prism pattern PRP1 may sequentially pass through the third surface S3 and the first surface S1 and proceed in a diagonal direction that extends between the direction opposite to the first direction DR1 and the third direction DR3. For example, the light L_L1 emitted from the second light emitting element LD2 may be refracted on the third surface S3 and the first surface S1 of the first prism pattern PRP1, and may proceed along a path having a second emission angle EA2 based on the first surface S1.

Light L_L2 emitted from the fourth light emitting element LD4 may pass through the refractive layer LRL and proceed to the inside of the second prism pattern PRP2. The light traveling inside the second prism pattern PRP2 may sequentially pass through the sixth surface S6 and the fourth surface S4 and proceed in a diagonal direction that extends between the direction opposite to the first direction DR1 and the third direction DR3. For example, the light L_L2 emitted from the fourth light emitting element LD4 may be refracted on the sixth surface S6 and the fourth surface S4 of the second prism pattern PRP2, and may proceed along a path having the second emission angle EA2 based on the fourth surface S4.

Light L_L3 emitted from the sixth light emitting element LD6 may pass through the refractive layer LRL and proceed to the inside of the third prism pattern PRP3. The light traveling inside the third prism pattern PRP3 may sequentially pass through the ninth surface S9 and the seventh surface S7 and proceed in a diagonal direction that extends between the direction opposite to the first direction DR1 and the third direction DR3. For example, the light L_L3 emitted from the sixth light emitting element LD6 may be refracted on the ninth surface S9 and the seventh surface S7 of the third prism pattern PRP3, and may proceed along a path having the second emission angle EA2 based on the seventh surface S7. The second emission angle EA2 may be different from the first emission angle EA1. For example, the second emission angle EA2 may be a symmetric angle having the same size as the first emission angle EA1.

In this way, the light emitted from the second light emitting element LD2, the fourth light emitting element LD4, and the sixth light emitting element LD6 may pass through the first to third prism patterns PRP1 to PRP3 and proceed in a diagonal direction that extends between the direction opposite to the first direction DR1 and the third direction DR3. For example, by operating only the second, fourth, and sixth light emitting elements LD2, LD4, and LD6 which are alternately arranged with the odd numbered light emitting elements LD1, LD3 and LD5 and are each disposed to the right of an odd numbered light emitting element LD1, LD3 or LD5, a second image (for example, an image for a passenger seat) different from the first image can be provided in a left direction. In this case, the right side may be the first direction DR1, and the left side may be the direction opposite to the first direction DR1.

Figure 9:
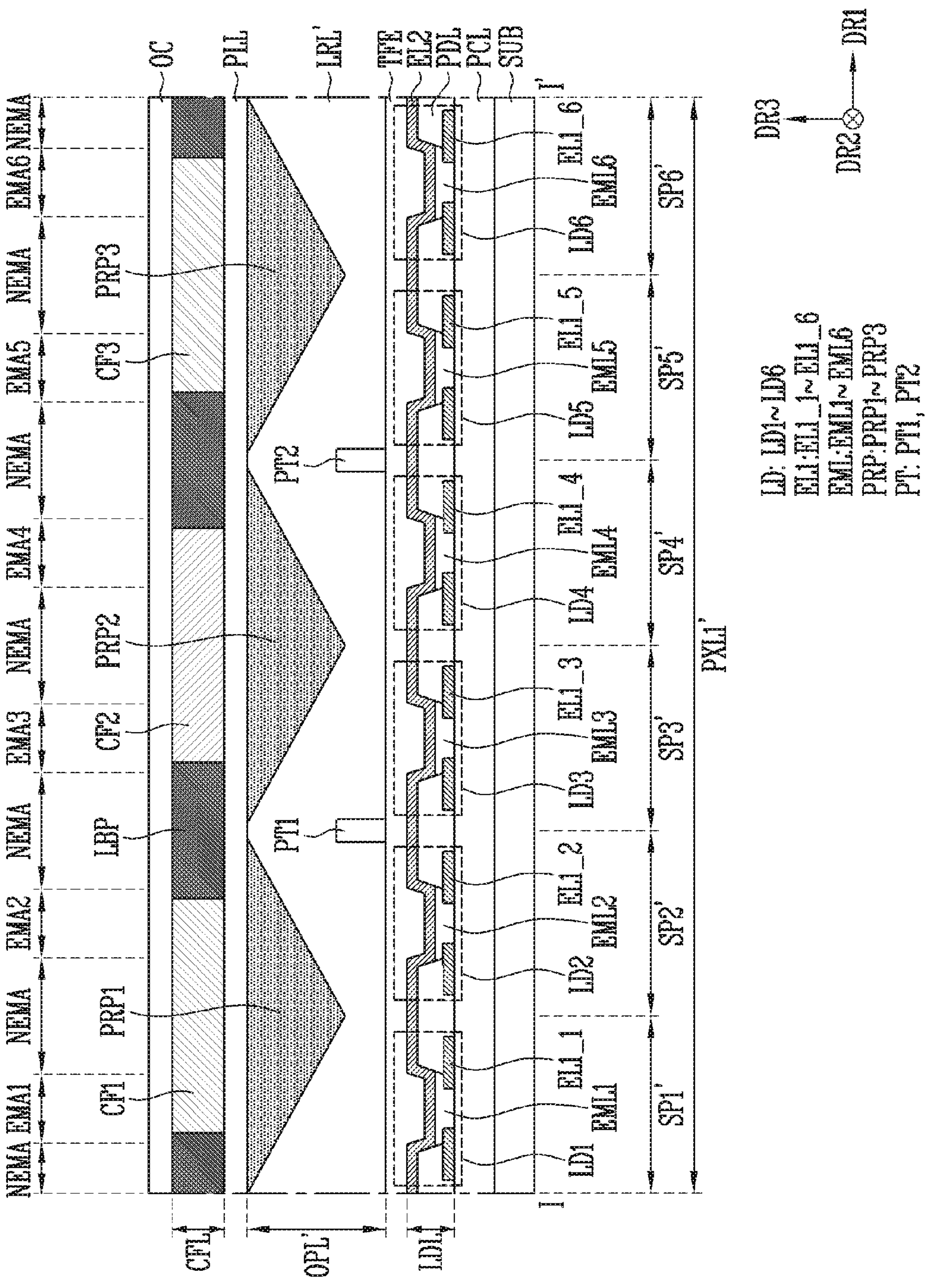
FIG. 9 is a cross-sectional view taken along line I-I' of FIG. 5 according to an embodiment of the present invention.

FIG. 9 is a cross-sectional view taken along line I-I' of FIG. 5 according to an embodiment of the present invention.

Referring to FIG. 9, a first pixel PXL1' may include first to sixth sub-pixels SP1' to SP6'. The first pixel PXL1' may include a substrate SUB, a pixel circuit layer PCL, first to sixth light emitting element LD1 to LD6, a light emitting element layer LDL, a thin film encapsulation layer TFE, a refractive layer LRL', first to third prism patterns PRP1 to PRP3, an optical layer OPL', first to third color filters CF1 to CF3, light blocking patterns LBP, and a color filter layer CFL.

The substrate SUB, the pixel circuit layer PCL, the first to sixth light emitting elements LD1 to LD6, the light emitting element layer LDL, the thin film encapsulation layer TFE, the first to third prism patterns PRP1 to PRP3, the first to third color filters CF1 to CF3, the light blocking patterns LBP, and the color filter layer CFL can be described similarly to those of the embodiments of FIG. 6. Hereinafter, overlapping descriptions related to the embodiments of FIG. 6 will be omitted or briefly discussed, and differences from the above-described embodiments will be mainly described.

Referring to FIG. 9, the optical layer OPL' may further include partition walls PT disposed between the first to third prism patterns PRP1 to PRP3 and the light emitting element layer LDL. The partition walls PT may be disposed to be spaced apart from each other in the non-emission area NEMA. As an example, a first partition wall PT1 may be disposed in the non-emission area NEMA that is between the second light emitting element LD2 and the third light emitting element LD3. A second partition wall PT2 may be disposed in the non-emission area NEMA that is between the fourth light emitting element LD4 and the fifth light emitting element LD5. For example, the partition walls PT may overlap the light blocking patterns LBP.

The first and second partition walls PT1 and PT2 may protrude in the third direction DR3 on the light emitting element layer LDL. One side of the first partition wall PT1 may face the light emitting element layer LDL, and the remaining sides may be at least partially surrounded by the refractive layer LRL'. According to one embodiment of the present invention, the first and second partition walls PT1 and PT2 may have substantially the same height as one another, but the present invention is not limited thereto.

In addition, the first and second partition walls PT1 and PT2 may have various shapes. For example, the first and second partition walls PT1 and PT2 may have a rectangular cross-sectional shape as shown in FIG. 9, but the present invention is not limited thereto. For example, the first and second partition walls PT1 and PT2 may have a trapezoidal cross-sectional shape whose width becomes narrower toward the top.

In this way, by disposing the partition walls PT to overlap the light blocking patterns LBP, color mixing (e.g., cross-talk) between adjacent sub-pixels that emit light of different colors can be prevented. For example, the first partition wall PT1 may minimize color mixing between a second sub-pixel SP2' and a third sub-pixel SPY. The second partition wall PT2 may minimize color mixing between a fourth sub-pixel SP4' and a fifth sub-pixel SP5'.

Figure 10:
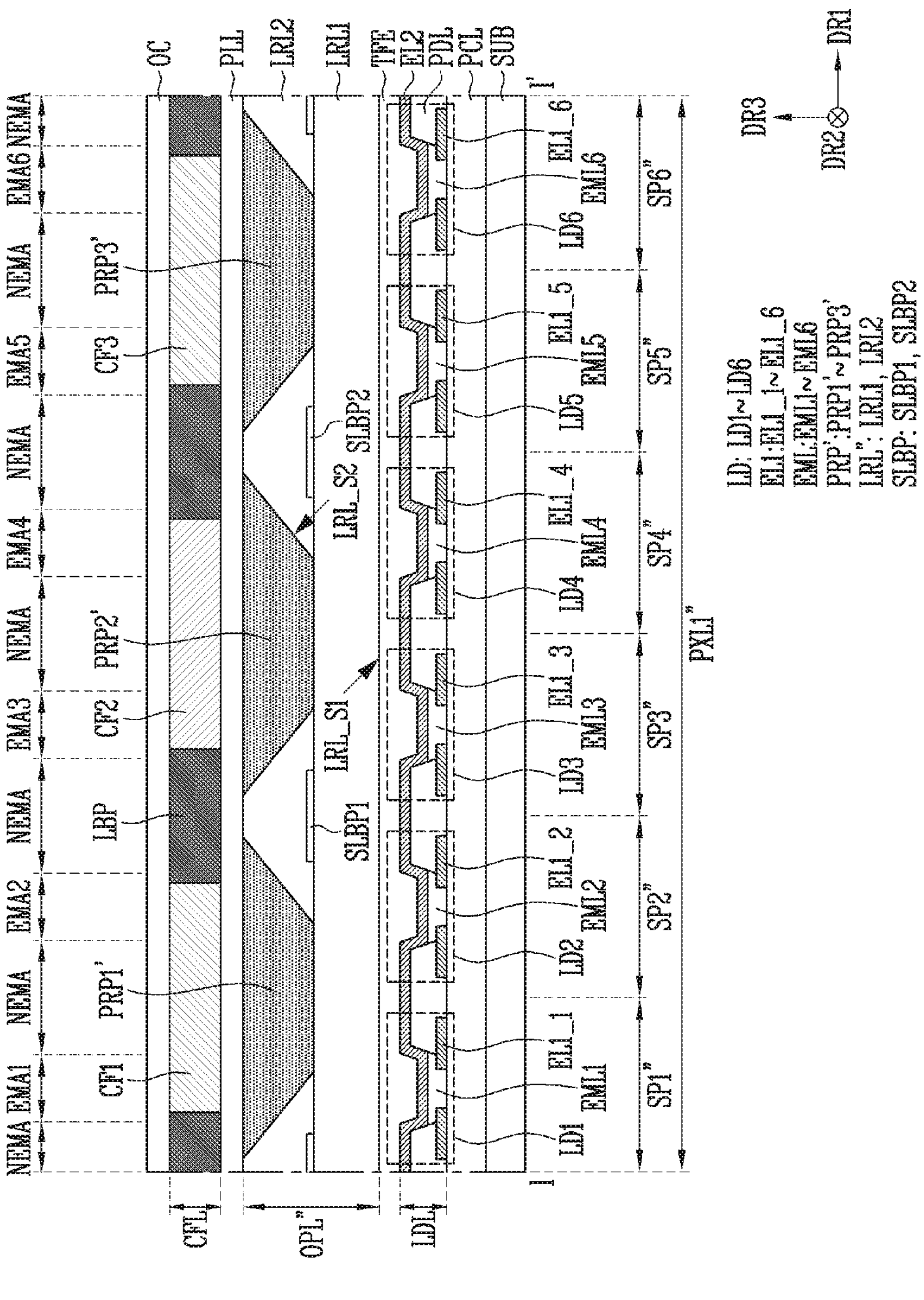
FIG. 10 is a cross-sectional view taken along line I-I' of FIG. 5 according to an embodiment of the present invention.

FIG. 10 is a cross-sectional view taken along line I-I' of FIG. 5 according to an embodiment of the present invention.

Referring to FIG. 10, a first pixel PXL1" may include first to sixth sub-pixels SP1" to SP6". The first pixel PXL1" may include a substrate SUB, a pixel circuit layer PCL, first to sixth light emitting elements LD1 to LD6, a light emitting element layer LDL, a thin film encapsulation layer TFE, a refractive layer LRL", first to third prism patterns PRP1 to PRP3, an optical layer OPL", first to third color filters CF1 to CF3, light blocking patterns LBP, and a color filter layer CFL.

The substrate SUB, the pixel circuit layer PCL, the first to sixth light emitting elements LD1 to LD6, the light emitting element layer LDL, the thin film encapsulation layer TFE, the first to third prism patterns PRP1 to PRP3, the first to third color filters CF1 to CF3, the light blocking patterns LBP, and the color filter layer CFL can be described similarly to those of the embodiments of FIG. 6. Hereinafter, overlapping descriptions related to the embodiments of FIG. 6 will be omitted or briefly discussed, and differences from the above-described embodiments will be mainly described.

Referring to FIG. 10, the optical layer OPL" may further include first to third prism patterns PRP1 to PRP3 and auxiliary light blocking patterns SLBP.

Each of the first to third prism patterns PRP1' to PRP3' may have lower surfaces forming a reverse tapered shape and adjacent to the light emitting element layer LDL. In addition, each of the first to third prism patterns PRP1' to PRP3' may have an inverted trapezoidal cross-sectional shape as shown in FIG. 10. In this case, each of the first to third prism patterns PRP1' to PRP3' may further include a lower surface facing the light emitting element layer LDL and connecting the lower surfaces that are reverse tapered to be symmetrical to each other. For example, the lower surfaces that are reverse tapered extend in diagonal directions towards each other.

The auxiliary light blocking patterns SLBP may be disposed in the non-emission area NEMA between at least two of the first to third prism patterns PRP1 to PRP3 within the refractive layer LRL". As an example, a first auxiliary light blocking pattern SLBP1 may be disposed in the non-emission area NEMA that is between the first and second prism patterns PRP1 and PRP2. A second auxiliary light blocking pattern SLBP2 may be disposed in the non-emission area NEMA that is between the second and third prism patterns PRP2 and PRP3.

According to one embodiment of the present invention, the refractive layer LRL" may include a first surface LRL_S1, which is adjacent to the light emitting element layer LDL, and a second surface LRL_S2, which is opposite to the first surface LRL_S1. The second surface LRL_S2 of the refractive layer LRL" may have a shape that is complementary to the lower surfaces of the prism patterns PRP'. For example, the second surface LRL_S2 of the refractive layer LRL" may be in contact with lower surfaces of the first prism pattern PRP1', lower surfaces of the second prism pattern PRP2', and lower surfaces of the third prism pattern PRP3'.

The refractive layer LRL" may include a first refractive layer LRL1 adjacent to the light emitting element layer LDL. In addition, the refractive layer LRL" may include a second refractive layer LRL2 that is adjacent to the lower surfaces of the prism patterns PRP'. In this case, the auxiliary light blocking patterns SLBP may be arranged to be spaced apart from each other in the first direction DR1 between the first and second refractive layers LRL1 and LRL2 sequentially arranged in the third direction DR3.

The auxiliary light blocking patterns SLBP may overlap the light blocking patterns LBP. As an example, the first auxiliary light blocking pattern SLBP1 may be disposed below a light blocking pattern LBP disposed between the first and second color filters CF1 and CF2 and may overlap the light blocking pattern LBP. The second auxiliary light blocking pattern SLBP2 may be disposed below a light blocking pattern LBP disposed between the second and third color filters CF2 and CF3 and may overlap the light blocking pattern LBP.

In embodiments of the present invention, the auxiliary light blocking patterns SLBP may include at least one of various types of light blocking materials. For example, the auxiliary light blocking patterns SLBP may include a conductive material that blocks light. In embodiments of the present invention, the auxiliary light blocking patterns SLBP may include the same material as that of the light blocking patterns LBP.

In this way, by disposing the auxiliary light blocking patterns SLBP to overlap the light blocking patterns LBP inside the refractive layer LRL", color mixing (e.g., cross-talk) between adjacent sub-pixels that emit light of different colors can be prevented. For example, the first auxiliary light blocking pattern SLBP1 may minimize color mixing between the second sub-pixel SP2" and the third sub-pixel SPY". The second auxiliary light blocking pattern SLBP2 may minimize color mixing between the fourth sub-pixel SP4" and the fifth sub-pixel SP5".

Figure 11:
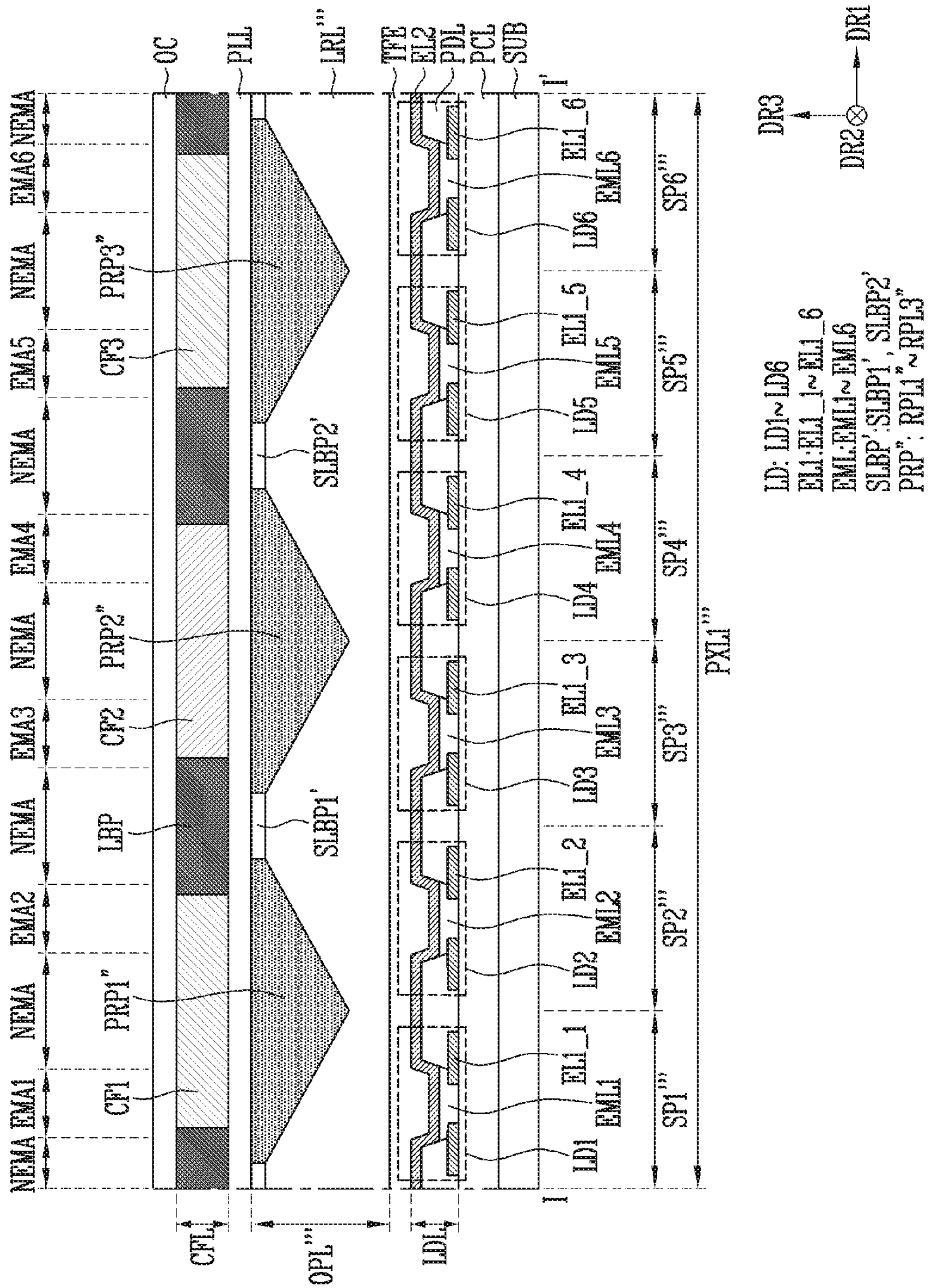
FIG. 11 is a cross-sectional view taken along line I-I' of FIG. 5 according to an embodiment of the present invention.

FIG. 11 is a cross-sectional view taken along line I-I' of FIG. 5 according to an embodiment of the present invention.

Referring to FIG. 11, a first pixel PXL1''' may include first to sixth sub-pixels SP1''' to SP6'''. The first pixel PXL1''' may include a substrate SUB, a pixel circuit layer PCL, first to sixth light emitting elements LD1 to LD6, a light emitting element layer LDL, a thin film encapsulation layer TFE, a refractive layer LRL''', first to third prism patterns PRP1 to PRP3, an optical layer OPL''', first to third color filters CF1 to CF3, light blocking patterns LBP, and a color filter layer CFL.

The substrate SUB, the pixel circuit layer PCL, the first to sixth light emitting elements LD1 to LD6, the light emitting element layer LDL, the thin film encapsulation layer TFE, the first to third prism patterns PRP1 to PRP3, the first to third color filters CF1 to CF3, the light blocking patterns LBP, and the color filter layer CFL can be described similarly to those of the embodiments of FIG. 6. Hereinafter, overlapping descriptions related to the embodiments of FIG. 6 will be omitted or briefly described, and differences from the above-described embodiments will be mainly described.

Referring to FIG. 11, the optical layer OPL''' may further include first to third prism patterns PRP1" to PRP3" and auxiliary light blocking patterns SLBP'.

Each of the first to third prism patterns PRP1" to PRP3" may have lower surfaces reverse tapered (e.g., surfaces that extend in diagonal directions towards each other) and adjacent to the light emitting element layer LDL. For example, each of the first to third prism patterns PRP1" to PRP3" may have an inverted pentagonal cross-sectional shape as shown in FIG. 11. In this case, each of the first to third prism patterns PRP1" to PRP3" may further include lower surfaces in contact with the auxiliary light blocking patterns SLBP'.

The auxiliary light blocking patterns SLBP' may be disposed in the non-emission area NEMA that is between at least two of the first to third prism patterns PRP1" to PRP3". As an example, a first auxiliary light blocking pattern SLBP1' may be disposed in the non-emission area NEMA that is between the first and second prism patterns PRP1" and PRP2". A second auxiliary light blocking pattern SLBP2' may be disposed in the non-emission area NEMA that is between the second and third prism patterns PRP2" and PRP3". For example, the optical layer OPL''' may include the first prism pattern PRP1", the first auxiliary light blocking pattern SLBP1', the second prism pattern PRP2", the second auxiliary light blocking pattern SLBP2', and the third prism pattern PRP3" sequentially arranged in the first direction DR1.

The auxiliary light blocking patterns SLBP' may overlap the light blocking patterns LBP. As an example, the first auxiliary light blocking pattern SLBP1' may be disposed below a light blocking pattern LBP disposed between the first and second color filters CF1 and CF2 and may overlap the light blocking pattern LBP. The second auxiliary light blocking pattern SLBP2' may be disposed below a light blocking pattern LBP disposed between the second and third color filters CF2 and CF3 and may overlap the light blocking pattern LBP.

In embodiments of the present invention, the auxiliary light blocking patterns SLBP' may include at least one of various types of light blocking materials. For example, the auxiliary light blocking patterns SLBP' may include a conductive material that blocks light. In embodiments of the present invention, the auxiliary light blocking patterns SLBP' may include the same material as that of the light blocking patterns LBP.

A planarization layer PLL may be disposed on the auxiliary light blocking patterns SLBP'. The planarization layer PLL may provide a flat upper surface while covering the first to third prism patterns PRP1" to PRP3" and the auxiliary light blocking patterns SLBP'. For example, the first to third prism patterns PRP1" to PRP3" and the auxiliary light blocking patterns SLBP' may be in contact with the planarization layer PLL.

In this way, by disposing the auxiliary light blocking patterns SLBP' between the prism patterns PRP" to overlap the light blocking patterns LBP, color mixing (e.g., cross-talk) between adjacent sub-pixels that emit light of different colors can be prevented. For example, the first auxiliary light blocking pattern SLBP1' may minimize color mixing between the second sub-pixel SP2''' and the third sub-pixel SPY". The second auxiliary light blocking pattern SLBP2' may minimize color mixing between the fourth sub-pixel SP4''' and the fifth sub-pixel SP5'''.

Figure 12:
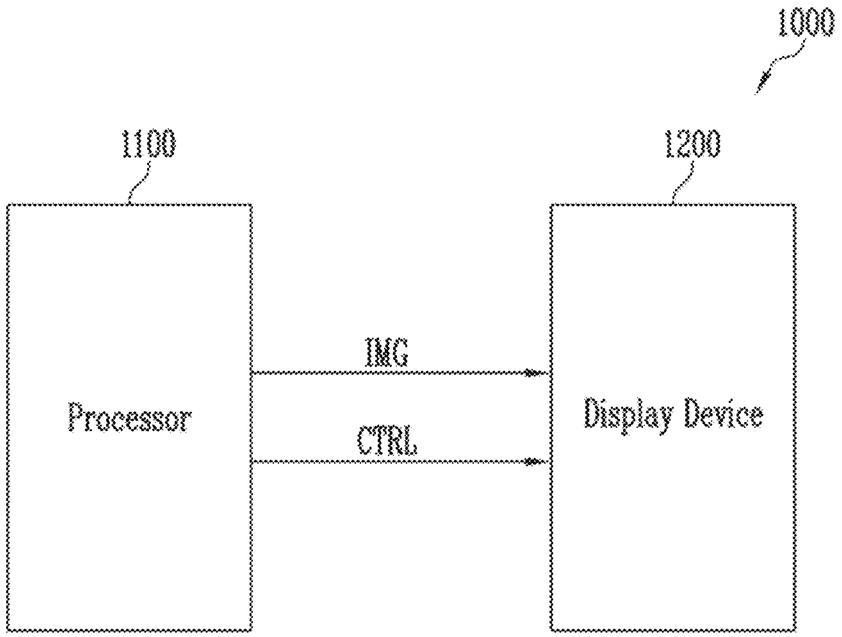
FIG. 12 is a block diagram illustrating a display system to which the display device of FIG. 1 is applied, according to an embodiment of the present invention.

FIG. 12 is a block diagram illustrating a display system to which the display device of FIG. 1 is applied, according to an embodiment of the present invention.

Referring to FIG. 12, a display system 1000 may include a processor 1100 and a display device 1200.

The processor 1100 may perform various tasks and calculations. In embodiments of the present invention, the processor 1100 may include an application processor, a graphics processor, a microprocessor, a central processing unit (CPU), and the like. The processor 1100 may be connected to other components of the display system 1000 through a bus system to control them.

The processor 1100 may transmit image data IMG and a control signal CTRL to the display device 1200. The display device 1200 may display an image based on the image data IMG and the control signal CTRL. The display device 1200 may be configured similarly or identically to the display device DD described with reference to FIG. 1. In this case, the image data IMG and the control signal CTRL may be provided as the input image data IMG and the control signal CTRL of FIG. 1, respectively.

The display system 1000 may include a computing system that provides an image display function, such as a smart watch, a mobile phone, a smart phone, a portable computer, a tablet personal computer, a watch phone, an automotive device, smart glasses, a portable multimedia player (PMP), a navigation system, and an ultra mobile personal computer (UMPC). In addition, the display system 1000 may include at least one of, for example, a head mounted display (HMD) device, a virtual reality (VR) device, a mixed reality (MR) device, and an augmented reality (AR) device.

Figure 13:
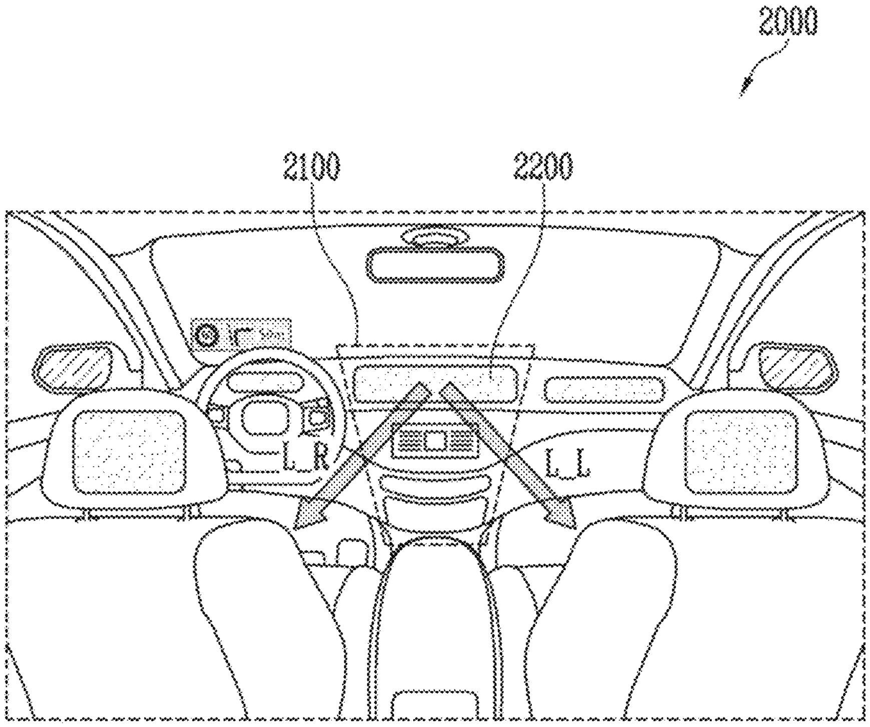
FIG. 13 is a perspective view illustrating the display system of FIG. 12 is applied, according to an embodiment of the present invention.

FIG. 13 is a perspective view illustrating the display system of FIG. 12 is applied, according to an embodiment of the present invention.

Referring to FIG. 13, the display system 1000 of FIG. 12 may be applied to an automotive display system 2000. Here, the automotive display system 2000 may include a computing system that is provided inside and/or outside a vehicle to provide image data.

The display system 1000 (see FIG. 12) and/or the display device 1200 (see FIG. 12) may be applied to an infotainment panel 2200 provided in a vehicle. For example, the infotainment panel 2200 may be formed on a center fascia 2100 inside the vehicle. The center fascia 2100 may be a panel board located between the driver's seat and the passenger seat in the center of a dashboard.

The infotainment panel 2200 may provide different images at specific angles on the left and right sides. As an example, the infotainment panel 2200 may display a first image from the center fascia 2100 toward the driver's seat, and may display a second image that is different from the first image toward the passenger seat. Here, the first image may be an image that is implemented by light L_R that is emitted by the operation of light emitting elements disposed on the left of each pixel PXL. The second image may be an image implemented by light L_L that is emitted by the operation of light emitting elements disposed on the right of each pixel PXL. For example, when a person is in the passenger seat, the infotainment panel 2200 of the center fascia 2100 may operate to display both the first image and the second image. In addition, when there is no person in the passenger seat, the infotainment panel 2200 of the center fascia 2100 may operate to display only the first image toward the driver's seat.

In a display device according to embodiments of the present invention, different images may be provided in specific directions by refracting light that is emitted from at least one of a plurality of light emitting elements that emit light of the same color through a prism pattern. According to embodiments of the present invention, the display device may efficiently provide images according to desire.

According to embodiments of the present invention, a display device that efficiently provides images can be provided.

Effects according to embodiments of the present invention are not limited to those described above, and various other effects are included in the present specification.

While the present invention has been particularly shown and described with reference to embodiments thereof, it will be apparent to those of ordinary skill in the art that various changes in form and detail may be made thereto without departing from spirit and scope of the present invention.

What is claimed is:

1. A display device comprising:

a substrate;

a light emitting element layer disposed on the substrate and including a first light emitting element, a second light emitting element, a third light emitting element, and a fourth light emitting element, wherein the first light emitting element and the second light emitting element emit light of a first color and are adjacent to each other, and wherein the third light emitting element and the fourth light emitting element emit light of a second color and are adjacent to each other;

a color filter layer disposed on the light emitting element layer and including a first color filter overlapping the first and second light emitting elements, a second color filter overlapping the third and fourth light emitting elements, and a light blocking pattern disposed between the first and second color filters; and an optical layer disposed between the light emitting element layer and the color filter layer and including a first prism pattern and a second prism pattern, wherein the first prism pattern overlaps the first and second light emitting elements, and the second prism pattern overlaps the third and fourth light emitting elements, wherein each of the first and second prism patterns has an upper surface and two lower surfaces that extend in a diagonal direction with respect to the upper surface and are adjacent to the light emitting element layer, and wherein the two lower surfaces of the first prism pattern respectively overlap the first and second light emitting elements, and the two lower surfaces of the second prism pattern respectively overlap the third and fourth light emitting elements.

2. The display device of claim 1, wherein the first prism pattern includes:

a first surface adjacent to the color filter layer and overlapping the first and second light emitting elements;

a second surface adjacent to the light emitting element layer and extending from a first side of the first surface and overlapping the first light emitting element; and a third surface adjacent to the light emitting element layer and extending from a second side of the first surface and overlapping the second light emitting element, wherein the first surface is the upper surface of the first prism pattern, and the second and third surfaces are the lower surfaces of the first prism pattern, and wherein the second prism pattern includes:

a fourth surface adjacent to the color filter layer and overlapping the third and fourth light emitting elements;

a fifth surface adjacent to the light emitting element layer and extending from a first side of the fourth surface and overlapping the third light emitting element; and a sixth surface adjacent to the light emitting element layer and extending from a second side of the fourth surface and overlapping the fourth light emitting element, wherein the fourth surface is the upper surface of the second prism pattern, and the fifth and sixth surfaces are the lower surfaces of the second prism pattern.

3. The display device of claim 2, wherein the second surface and the third surface are symmetrical to each other, and wherein the fifth surface and the sixth surface are symmetrical to each other.

4. The display device of claim 2, wherein light emitted from the first light emitting element is refracted on the second surface and proceeds along a path having a first emission angle, and wherein light emitted from the second light emitting element is refracted on the third surface and proceeds along a path having a second emission angle that is different from the first emission angle.

5. The display device of claim 1, wherein the lower surfaces of the first and second prisms have a slope in a range of about 30 degrees to about 50 degrees.

6. The display device of claim 1, wherein the first prism pattern overlaps the first color filter, and wherein the second prism pattern overlaps the second color filter.

7. The display device of claim 6, wherein a cross-sectional area of the first color filter is smaller than or equal to a cross-sectional area of the first prism pattern, and wherein a cross-sectional area of the second color filter is smaller than or equal to a cross-sectional area of the second prism pattern.

8. The display device of claim 1, wherein the optical layer further includes a partition wall disposed in a non-emission area that is between the second light emitting element and the third light emitting element.

9. The display device of claim 1, wherein the optical layer further includes a refractive layer disposed between the first and second prism patterns and the light emitting element layer, wherein the refractive layer has a first refractive index, and wherein each of the first and second prism patterns has a second refractive index that is higher than the first refractive index.

10. The display device of claim 9, wherein a difference between the first and second refractive indices increases as the first and second prism patterns decrease in thickness.

11. The display device of claim 9, wherein the refractive layer includes:

a first surface adjacent to the light emitting element layer; and a second surface opposite the first surface, wherein the second surface of the refractive layer has a shape complementary to the lower surfaces of the first prism pattern and the lower surfaces of the second prism pattern, and wherein the optical layer further includes an auxiliary light blocking pattern disposed in a non-emission area that is between the second light emitting element and the third light emitting element within the refractive layer.

12. The display device of claim 1, wherein the optical layer further includes an auxiliary light blocking pattern disposed between the first and second prism patterns, and wherein the auxiliary light blocking pattern overlaps the light blocking pattern.

13. The display device of claim 12, further comprising:

a planarization layer disposed between the optical layer and the color filter layer, wherein the first prism pattern, the second prism pattern, and the auxiliary light blocking pattern are in contact with the planarization layer.

14. The display device of claim 1, wherein each of the first and second prism patterns has a cross-sectional shape of at least one of an inverted triangle, an inverted trapezoid, or an inverted pentagon.

15. The display device of claim 1, wherein at least one of the first light emitting element or the second light emitting element is selectively driven, and wherein at least one of the third light emitting element or the fourth light emitting element is selectively driven.

16. The display device of claim 15, wherein the third light emitting element is driven together with the first light emitting element, and wherein the fourth light emitting element is driven together with the second light emitting element.

17. The display device of claim 1, wherein an interface between the optical layer and the first and second prism patterns form a saw tooth shape.

18. An electronic device comprising:

a processor providing input image data, and a display device displaying an image based on the input image data, wherein the display device including:

a substrate;

a light emitting element layer disposed on the substrate and including a first light emitting element, a second light emitting element, a third light emitting element, a fourth light emitting element, wherein the first light emitting element and the second light emitting element emit light of a first color and are adjacent to each other, wherein the third light emitting element and the fourth light emitting element emit light of a second color and are adjacent to each other;

a color filter layer disposed on the light emitting element layer and including a first color filter overlapping the first and second light emitting elements and a second color filter overlapping the third and fourth light emitting elements; and an optical layer disposed on the light emitting element layer and including a first prism pattern and a second prism pattern, wherein the first prism pattern overlaps the first and second light emitting elements, and the second prism pattern overlaps the third and fourth light emitting elements, wherein each of the first and second prism patterns has an upper surface and lower surfaces that extend in a diagonal direction with respect to the upper surface, wherein a first lower surface of the lower surfaces of the first prism pattern overlaps the first light emitting element and not the second light emitting element, and a second lower surface of the lower surfaces of the first prism pattern overlaps the second light emitting element and not the first light emitting element, and wherein a third lower surface of the lower surfaces of the second prism pattern overlaps the third light emitting element and not the fourth light emitting element, and a fourth lower surface of the lower surfaces of the second prism pattern overlaps the fourth light emitting element and not the third light emitting element.

19. The electronic device of claim 18, wherein the first prism pattern overlaps the first color filter, and wherein the second prism pattern overlaps the second color filter.

20. The electronic device of claim 18, wherein the first prism pattern is spaced apart from the second prism pattern.

* * * * *